US009059044B2

(12) United States Patent
Cheng et al.

(10) Patent No.: US 9,059,044 B2
(45) Date of Patent: Jun. 16, 2015

(54) ON-CHIP DIODE WITH FULLY DEPLETED SEMICONDUCTOR DEVICES

(71) Applicant: International Business Machines Corporation, Armonk, NY (US)

(72) Inventors: Kangguo Cheng, Schenectady, NY (US); Ali Khakifirooz, Mountain View, CA (US); Ghavam G. Shahidi, Pound Ridge, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 295 days.

(21) Appl. No.: 13/677,610

(22) Filed: Nov. 15, 2012

(65) Prior Publication Data
US 2014/0131803 A1  May 15, 2014

(51) Int. Cl.
*H01L 21/84* (2006.01)
*H01L 27/12* (2006.01)
*H01L 29/861* (2006.01)

(52) U.S. Cl.
CPC ........ *H01L 27/1214* (2013.01); *H01L 27/1259* (2013.01); *H01L 27/1255* (2013.01); *H01L 21/84* (2013.01); *H01L 21/845* (2013.01); *H01L 29/861* (2013.01); *H01L 27/1203* (2013.01); *H01L 27/1211* (2013.01)

(58) Field of Classification Search
CPC ............ H01L 27/1214; H01L 27/1255; H01L 27/1259
See application file for complete search history.

(56) References Cited

U.S. PATENT DOCUMENTS

| 6,974,983 | B1* | 12/2005 | Hill et al. ...................... 257/292 |
| 7,202,494 | B2 | 4/2007 | Blanchard et al. |
| 7,749,872 | B2 | 7/2010 | Plummer et al. |
| 7,936,040 | B2 | 5/2011 | Wu |
| 8,258,810 | B2* | 9/2012 | Or-Bach et al. ................. 326/39 |
| 2006/0091490 | A1 | 5/2006 | Chen et al. |
| 2006/0292765 | A1 | 12/2006 | Blanchard et al. |
| 2007/0052027 | A1 | 3/2007 | Ke et al. |

(Continued)

OTHER PUBLICATIONS

Kizilyalli, I. C., et al., "Improvement of Hot Carrier Reliability wit Deuterium Anneals for Manufacturing Multilevel Metal/Dielectric MOS Systems", IEEE Electron Device Letters, Nov. 1998, vol. 19, No. 11, pp. 444-446.

*Primary Examiner* — Richard Booth
(74) *Attorney, Agent, or Firm* — Scully, Scott, Murphy & Presser, P.C.; Louis J. Percello, Esq.

(57) ABSTRACT

An electrical device including a first conductivity semiconductor device present in a first semiconductor device region of an SOI substrate, and a second conductivity semiconductor device present in a second semiconductor device region of the SOI substrate. The electrical device also includes a diode present within a diode region of the SOI substrate that includes a first doped layer of a first conductivity semiconductor material that is present on an SOI layer of the SOI substrate. The first doped layer includes a first plurality of protrusions extending from a first connecting base portion. The semiconductor diode further includes a second doped layer of the second conductivity semiconductor material present over the first doped layer. The second doped layer including a second plurality of protrusions extending from a second connecting base portion. The second plurality of protrusions is present between and separating the first plurality of protrusions.

6 Claims, 19 Drawing Sheets

(56) References Cited

U.S. PATENT DOCUMENTS

| | | |
|---|---|---|
| 2009/0057780 A1 | 3/2009 | Wong et al. |
| 2009/0084181 A1 | 4/2009 | Kolb et al. |
| 2009/0280582 A1 | 11/2009 | Thijs et al. |
| 2009/0321882 A1 | 12/2009 | Park |
| 2010/0012976 A1 | 1/2010 | Hydrick et al. |
| 2010/0025683 A1 | 2/2010 | Cheng et al. |
| 2010/0072515 A1 | 3/2010 | Park et al. |
| 2011/0169049 A1 | 7/2011 | Loo et al. |
| 2011/0241152 A1 | 10/2011 | Hsiao et al. |
| 2011/0266674 A1 | 11/2011 | Hsia et al. |

\* cited by examiner

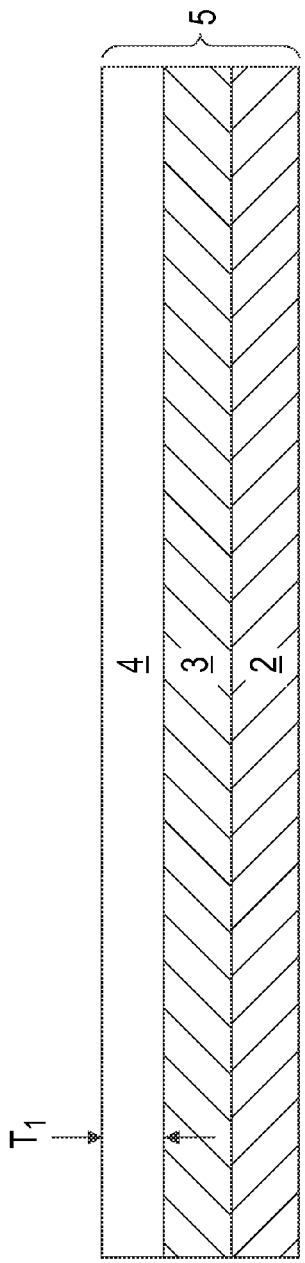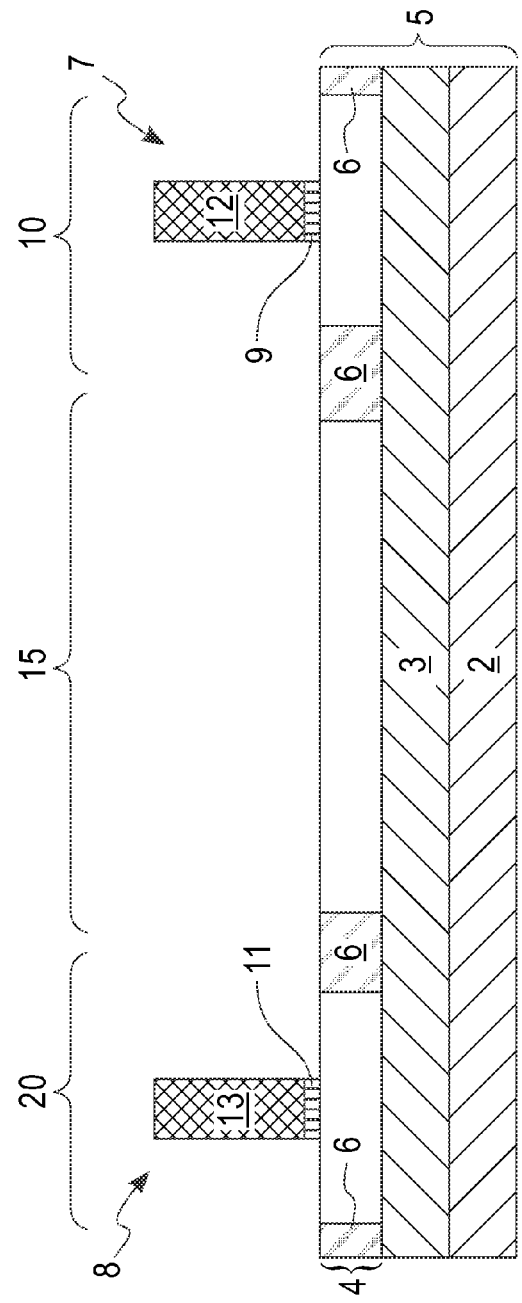

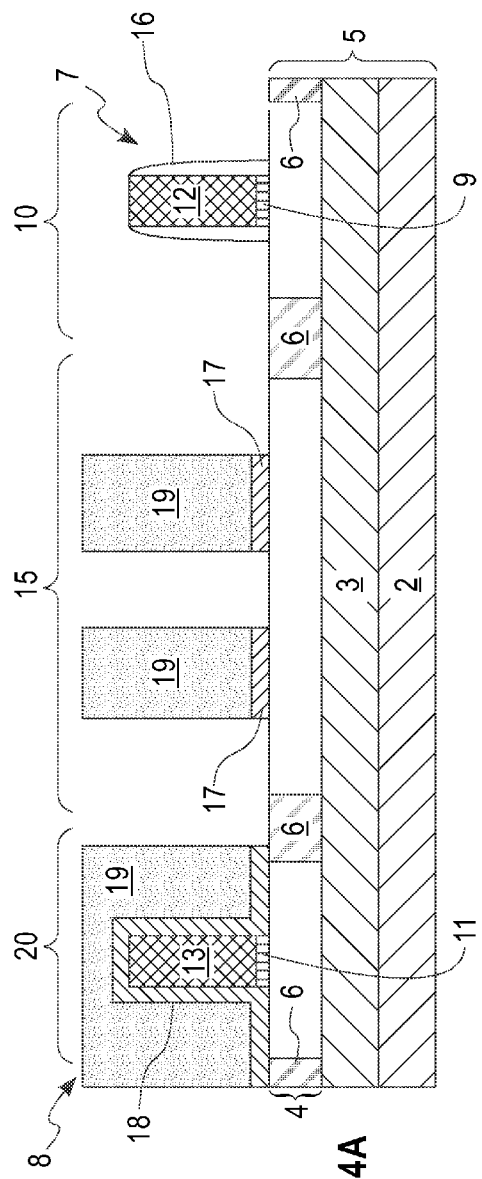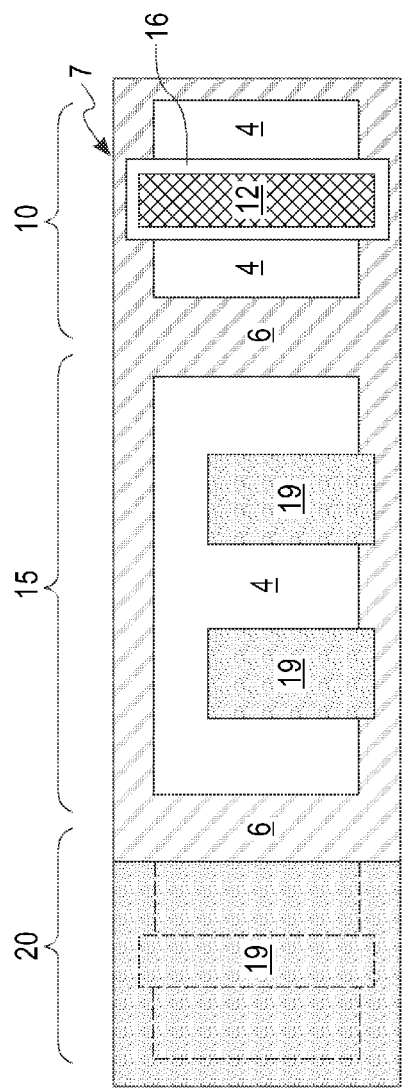
FIG. 4A
FIG. 4B

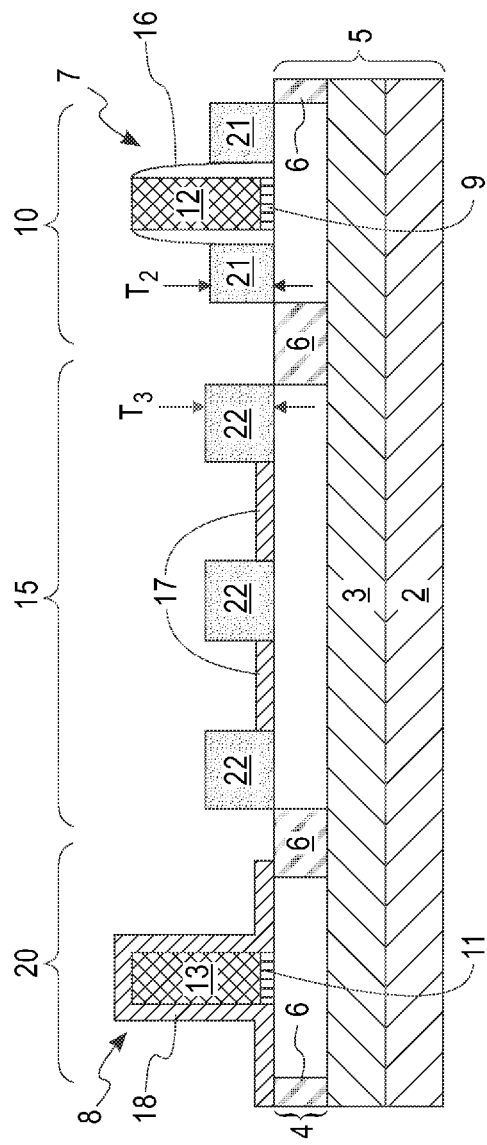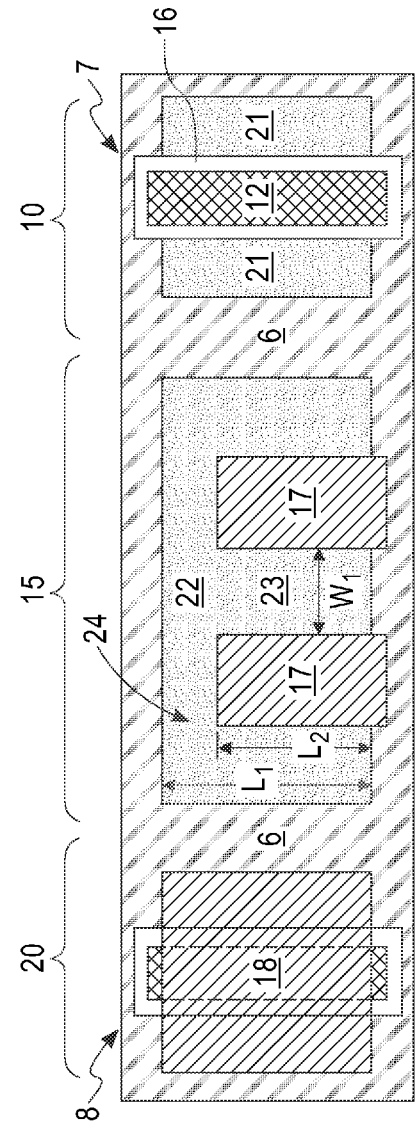

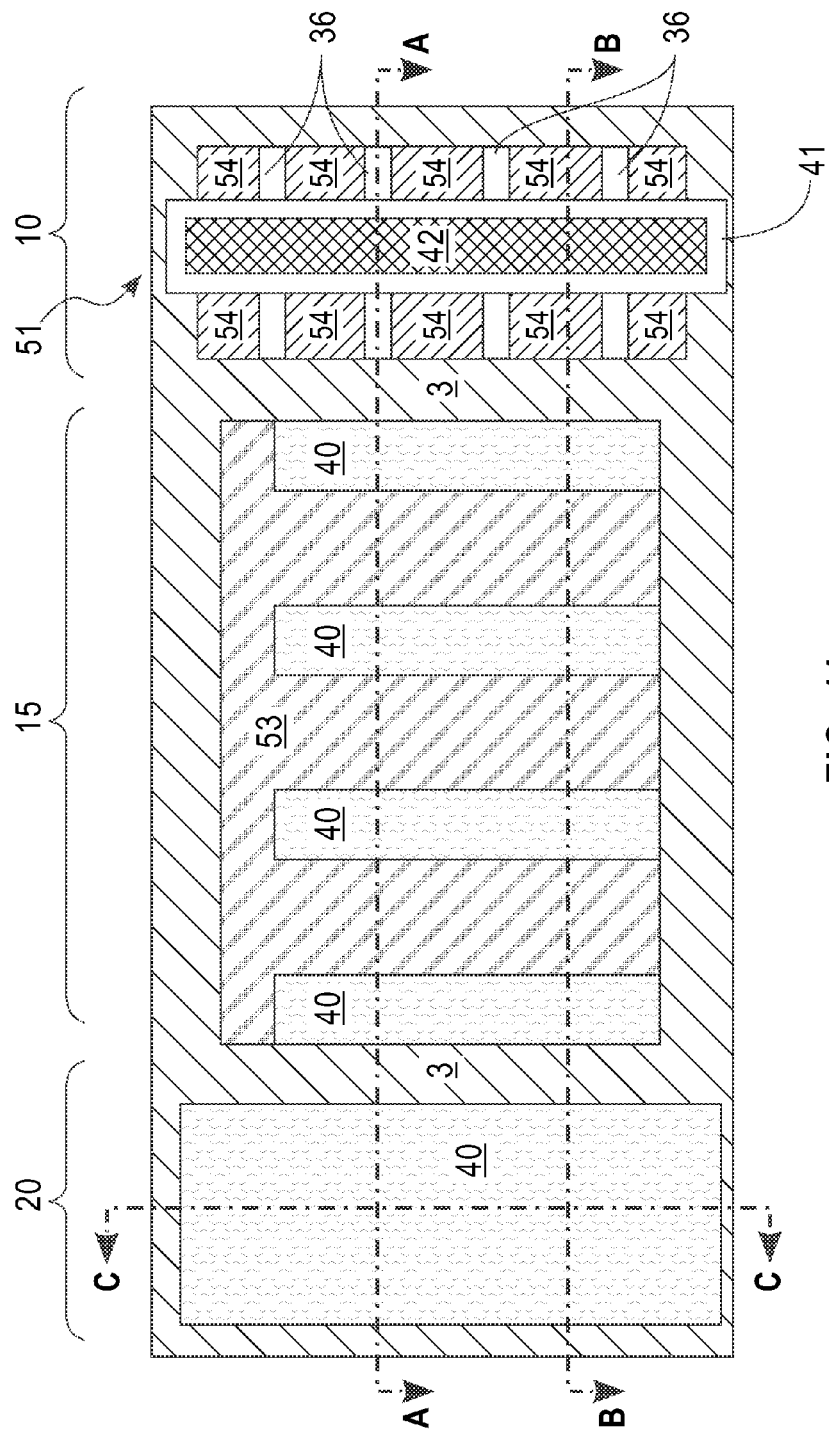

ON-CHIP DIODE WITH FULLY DEPLETED SEMICONDUCTOR DEVICES

BACKGROUND

The present disclosure generally relates to semiconductor devices. More particularly, the present disclosure relates to semiconductor devices in combination with on-chip diodes.

In order to be able to make integrated circuits (ICs) of higher integration density than currently feasible, one has to find ways to further downscale the dimensions of field effect transistors (FETs), and diodes that are included within the IC circuit. Scaling achieves compactness and improves operating performance in devices by shrinking the overall dimensions and operating voltages of the device while maintaining the device's electrical properties. In some examples, as the dimensions of the structures within an IC are decreased, the resistivity of some of the components may increase, which can degrade the performance of the devices within the IC.

SUMMARY

In one embodiment, a method of forming an electrical device is provided that includes forming a first conductivity type semiconductor device region, a second conductivity type semiconductor device region and a diode region in a semiconductor on insulator (SOI) layer of a SOI substrate. A first gate structure may be formed on the first conductivity type semiconductor device region, and a second gate structure may be formed on the second conductivity type semiconductor device region. A first conductivity semiconductor material is formed on the semiconductor on insulator layer on opposing sides of the first gate structure in the first conductivity type semiconductor device region and the semiconductor on insulator layer in the diode region. The first conductivity semiconductor material on the semiconductor on insulator layer in the first conductivity type semiconductor device region provides a first conductivity raised source region and a first conductivity raised drain region. A second conductivity semiconductor material is formed on the semiconductor on insulator layer on opposing sides of the second gate structure that is present in the second conductivity type semiconductor device region and on the first conductivity semiconductor material in the diode region. The second conductivity semiconductor material that is present on the semiconductor on insulator layer in the second conductivity type semiconductor device region provides a second conductivity raised source region and a second conductivity raised drain region. The stack of the second conductivity semiconductor material and the first conductivity semiconductor material in the diode region provides a semiconductor diode.

In another embodiment, a method of forming an electrical device is provided that includes forming a first conductivity type semiconductor device region including a first fin structure, a second conductivity type semiconductor device region including a second fin structure, and a diode region including a semiconductor island in a semiconductor on insulator layer of a semiconductor on insulator substrate. A first gate structure may be formed on the first fin structure in the first conductivity type semiconductor device region, and a second gate structure may be formed on the second fin structure in the second conductivity type semiconductor device region. A first conductivity semiconductor material is formed on the first fin structure on opposing sides of the first gate structure in the first conductivity type semiconductor device region and the semiconductor island in the diode region. The first conductivity semiconductor material on the first fin structure in the first conductivity type semiconductor device region provides a first conductivity source region and a first conductivity drain region. A second conductivity semiconductor material is formed on the second fin structure on opposing sides of the second gate structure that is present in the second conductivity type semiconductor device region and on the first conductivity semiconductor material that is present on the semiconductor island in the diode region. The second conductivity semiconductor material that is present on the second fin structure in the second conductivity type semiconductor device region provides a second conductivity source region and a second conductivity drain region. The stack of the second conductivity semiconductor material and the first conductivity semiconductor material in the diode region provides a semiconductor diode.

In another aspect, an electrical device is provided that includes a first conductivity type semiconductor device present in a first semiconductor device region of the semiconductor on insulator substrate. The first conductivity type semiconductor device includes a first source region and a first drain region comprised of a first conductivity semiconductor material in direct contact with the semiconductor on insulator layer of the semiconductor on insulator substrate. A second conductivity type semiconductor device is present in a second conductivity type semiconductor device region of the semiconductor on insulator substrate. The second conductivity type semiconductor device includes a second source region and a second drain region comprised of a second conductivity semiconductor material in direct contact with the semiconductor on insulator layer. A semiconductor diode is present in a diode region of the SOI substrate. The semiconductor diode includes a first doped layer of the first conductivity type semiconductor material that is present on the semiconductor on insulator layer. The first doped layer includes a first plurality of protrusions extending from a first connecting base portion. The semiconductor diode further includes a second doped layer of the second conductivity semiconductor material present over the first doped layer. The second doped layer including a second plurality of protrusions extending from a second connecting base portion. The second plurality of protrusions is present between and separating the first plurality of protrusions.

DESCRIPTION OF THE SEVERAL VIEWS OF THE DRAWINGS

The following detailed description, given by way of example and not intended to limit the disclosure solely thereto, will best be appreciated in conjunction with the accompanying drawings, wherein like reference numerals denote like elements and parts, in which:

FIG. 1 is a side cross-sectional view depicting one embodiment of an extremely thin semiconductor on insulator (ET-SOI) substrate for forming an electrical device including at least one semiconductor device and at least one diode, in accordance with the present disclosure.

FIG. 2A is a side cross-sectional view depicting forming a first gate structure within a first conductivity type semiconductor device region of the extremely thin semiconductor on insulator substrate, and forming a second gate structure within a second conductivity type semiconductor device region of the extremely thin semiconductor on insulator substrate, in accordance with the present disclosure.

FIG. 4A is a side cross-sectional view depicting etching the dielectric layer that is depicted in FIG. 3 to form at least one first gate sidewall spacer adjacent to the first gate structure in the first conductivity type semiconductor device region, a plurality of dielectric strips in the diode region, and a remaining portion of the dielectric layer within the second conductivity type device region, in accordance with the present disclosure.

FIG. 4B is a top down view of the structure depicted in FIG. 4A.

FIG. 5A is a side cross-sectional view depicting forming a first portion of a first conductivity semiconductor material on the semiconductor on insulator layer on opposing sides of the first gate structure in the first conductivity type semiconductor device region, and forming a second portion of the first conductivity semiconductor material on the semiconductor on insulator layer in the diode region, in accordance with one embodiment of the present disclosure.

FIG. 5B is a top down view of the structure depicted in FIG. 5A.

FIG. 11 is a top down view depicting forming a first portion of a first conductivity semiconductor material on the semiconductor on insulator layer on opposing sides of the first gate structure of the fin field effect transistor in the first conductivity type semiconductor device region and forming a second portion of the first conductivity semiconductor material on the semiconductor on insulator layer in the diode region, in accordance with one embodiment of the present disclosure.

DETAILED DESCRIPTION

Figure 2B:
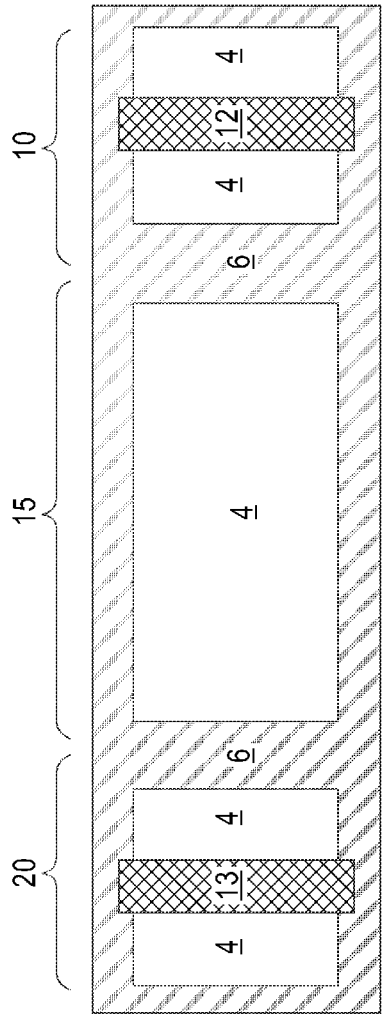
FIG. 2B is a top down view of the structure depicted in FIG. 2A.

Detailed embodiments of the present disclosure are disclosed herein; however, it is to be understood that the disclosed embodiments are merely illustrative and may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the embodiments of the present disclosure. For purposes of the description hereinafter, the terms "upper", "lower", "vertical", "horizontal", "top", "bottom", and derivatives thereof shall relate to the embodiments of the disclosure, as it is oriented in the drawing figures.

Some embodiments of the present disclosure relate to full depleted devices, such as semiconductor devices having a channel region present in the upper semiconductor layer of an extremely thin semiconductor on insulator substrate (ETSOI) substrate, being integrated with diodes on the same substrate, i.e., chip. Integration of diodes with fully depleted complementary metal oxide semiconductor devices that are present on extremely thin semiconductor on insulator substrates can be challenging, because diodes are typically made of thicker semiconductor material layers than the upper semiconductor layer of an extremely thin semiconductor on insulator substrate. An "extremely thin semiconductor on insulator substrate" is a semiconductor on insulator substrate, in which the semiconductor on insulator layer has a thickness of 10 nm or less. A "semiconductor diode" is a crystalline piece of semiconductor material with a p-n junction connected to two electrical terminals. In some embodiments, the methods and structures disclosed herein provide for integration of fully depleted semiconductor devices and semiconductor diodes on the same extremely thin semiconductor on insulator substrate.

FIGS. 1-8B depict one embodiment of forming a semiconductor diode 120 and complementary metal oxide semiconductor of field effect transistors 100, 110 on the same extremely thin semiconductor on insulator substrate 5. Although the semiconductor devices that are depicted in FIGS. 1-8B are field effect transistors (FETs), it is noted that any semiconductor device is suitable for use with the methods and structures of the present disclosure. A "field effect transistor" is a semiconductor device in which the output current, i.e., source-drain current, is controlled by the voltage applied to the gate structure. The term "gate structure" means a structure used to control output current (i.e., flow of carriers in the channel) of a semiconducting device through electrical or magnetic fields.

FIG. 1 depicts one embodiment of an extremely thin semiconductor on insulator substrate 5 that is suitable for forming an electrical device including at least one semiconductor device and at least one semiconductor diode, in accordance with the methods and structures disclosed herein. The extremely thin semiconductor on insulator substrate 5 includes a semiconductor on insulator layer 4 over a buried dielectric layer 3 having a thickness T1 of less than 10 nm, wherein the buried dielectric layer 3 is present on a base semiconductor layer 2. The semiconductor on insulator layer 4 may comprise any semiconducting material including, but not limited to silicon (Si), strained Si, SiC, SiGe, SiGeC, Si alloys, Ge, Ge alloys, GaAs, InAs, and InP, or any combination thereof. The semiconductor on insulator layer 4 may be thinned to a desired thickness for the extremely thin semiconductor on insulator substrate 5 by planarization, grinding, wet etch, dry etch, oxidation followed by oxide etch, or any combination thereof. One method of thinning the semiconductor on insulator layer 4 is to oxidize the silicon (Si) by a thermal dry or wet oxidation process, and then wet etch the oxide layer using a hydrofluoric acid mixture. This process can be repeated to achieve the desired thickness. In one embodiment, the semiconductor on insulator layer 4 of the extremely thin semiconductor on insulator substrate 5 has a thickness ranging from 1.0 nm to 10.0 nm. In another embodiment, the semiconductor on insulator layer 4 has a thickness ranging from 1.0 nm to 5.0 nm. In a further embodiment, the semiconductor on insulator layer 4 has a thickness ranging from 3.0 nm to 8.0 nm. The base semiconductor layer 2 may be a semiconducting material including, but not limited to Si, strained Si, SiC, SiGe, SiGeC, Si alloys, Ge, Ge alloys, GaAs, InAs, InP as well as other III/V and II/VI compound semiconductors. The buried dielectric layer 3 may be composed of any dielectric material. For example, the buried dielectric layer 3 may be composed of an oxide, e.g., silicon oxide, a nitride, e.g., silicon nitride, silicon oxynitride or a combination thereof. The buried dielectric layer 3 may have a thickness of 300 nm or less. In another embodiment, the buried dielectric layer 3 may have a thickness ranging from 2 nm to 150 nm. In yet another embodiment, the buried dielectric layer 3 may have a thickness ranging from 5 nm to 30 nm.

The buried dielectric layer 3 that is present underlying the semiconductor on insulator layer 4 and atop the base semiconductor layer 2 may be formed by implanting a high-energy dopant into the ETSOI substrate 5 and then annealing the structure to form a buried insulating layer, i.e., buried dielectric layer 3. In another embodiment, the buried dielectric layer 3 may be deposited or grown prior to the formation of the semiconductor on insulator layer 4. In yet another embodiment, the extremely thin semiconductor on insulator substrate 5 may be formed using wafer-bonding techniques, where a bonded wafer pair is formed utilizing glue, adhesive polymer, or direct bonding.

FIGS. 2A and 2B depict one embodiment of forming a first gate structure 7 on a first conductivity type semiconductor device region 10 and a second gate structure 8 on the second conductivity type semiconductor device region 20 of the extremely thin semiconductor on insulator substrate 5 that is depicted in FIG. 1. The term "conductivity type" denotes whether a semiconductor device, e.g., field effect transistor, has a p-type or n-type conductivity. For example, in the case of field effect transistors, a p-type field effect transistor has source and drain regions that are doped with a p-type dopant, and an n-type field effect transistor has source and drain regions that are doped with an n-type dopant. A diode region 15 is present between and separating the first conductivity type semiconductor device region 10 from the second conductivity type semiconductor device region 20. In one embodiment, the first conductivity semiconductor device region 10 is processed to provide a p-type field effect transistor, the second conductivity device region 20 is processed to provide an n-type field effect transistor and the diode region 15 is processed to provide a semiconductor diode. An isolation region 6 typically separates the first conductivity type semiconductor device region 10 and the second conductivity type semiconductor device region 20 from the diode region 15 of the ETSOI substrate 5. The isolation region 6 typically surrounds the first and second conductivity semiconductor device regions 10, 20 and the diode region 15, and therefore defines the length and width dimensions of the first and second conductivity semiconductor device regions 10, 20 and the diode region 15.

The isolation region 6 may be formed using etching and deposition processes. For example, and in one embodiment, an etch mask, such as a patterned photoresist, may be formed on the semiconductor on insulator layer 4, in which the opening through the etch mask exposes the portion of the semiconductor on insulator layer 4 in which the isolation region 6 is to be formed. An etch process may then remove the exposed portions of the semiconductor on insulator layer 4 with an etch chemistry that is selective to the buried dielectric layer 3 and the etch mask. In one embodiment, the etch process that removes the exposed portions of the semiconductor on insulator layer 4 is an anisotropic etch process, such as reactive ion etch (RIE). The opening, e.g., trench that is formed by etching the semiconductor on insulator layer 4 is then filled with a dielectric material to provide the isolation region 6, e.g., trench isolation region. In one embodiment, chemical vapor deposition or another like deposition process is used to fill the opening, e.g., trench, with a dielectric material, such as an oxide, nitride or oxynitride material.

Still referring on FIGS. 2A and 2B, the first gate structure 7 of the first conductivity type semiconductor device region 10 and second gate structure 8 of the second conductivity type semiconductor device region 20 may each include at least one gate dielectric 9, 11 and at least one gate conductor 12, 13. The at least one gate dielectric 9 that is in the first conductivity type semiconductor device region 10 may be composed of the same composite material as the at least one gate dielectric 11 that is present in the second conductivity type semiconductor device region 20. The at least one gate dielectric 9, 11 may comprise dielectric materials such as oxides, nitrides and oxynitrides of silicon. In some embodiments, the at least one gate dielectric 9, 11 may be composed of a high-k dielectric material. The term "high-k", as used herein, denotes a dielectric constant that is greater than the dielectric constant of silicon oxide, which is typically equal to 4 (i.e., typically a silicon oxide) measured in vacuum at room temperature (20° C. to 25° C.). For example, the at least one gate dielectric 9, 11 may comprise generally higher dielectric constant dielectric materials having a dielectric constant from about 8 to at least about 100. Such higher dielectric constant dielectric materials may include, but are not limited to hafnium oxides, hafnium silicates, zirconium oxides, lanthanum oxides, titanium oxides, barium-strontium-titantates (BSTs) and lead-zirconate-titanates (PZTs). The at least one gate dielectric 9, 11 may be formed using any of several methods that are appropriate to their material(s) of composition. Non limiting examples include thermal or plasma oxidation or nitridation methods, chemical vapor deposition methods (including atomic layer deposition methods) and physical vapor deposition methods.

The at least one gate conductor 12, 13 may comprise materials including, but not limited to metals, metal alloys, metal nitrides and metal silicides, as well as laminates thereof and composites thereof. Each of the gate conductors 12, 13 for the first conductivity type semiconductor device region 10 and the second conductivity type device region 20 may have the same composition. The at least one gate conductor 12, 13 may also comprise doped polysilicon and polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods. Typically, each of the at least one gate conductor 12, 13 comprises a doped polysilicon material that has a thickness from about 400 to about 2000 angstroms.

In some embodiments, the first gate structure 7 and the second gate structure 8 may be formed by blanket depositing the material layers for the at least one gate dielectric 9, 11, and the at least one gate conductor 12, 13 to provide a gate stack, wherein the gate stack is patterned and etched to provide the first gate structure 7 and the second gate structure 8. Specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. Alternatively, the first and second gate structure 7, 8 can be formed by replacement gate technology. In replacement gate process sequence, a sacrificial gate structure is formed at this stage of the process flow. The sacrificial gate structure may also be referred to as a dummy gate. The sacrificial gate structure may be composed of a semiconductor material. Later in the process sequence, the sacrificial gate structure is removed, and replaced with a function gate structure having at least one gate dielectric 9, 11 and the at least one gate conductor 12, 13, as described above. In some instances, in the replacement gate method, the functional gate structure may be formed after the source and drain regions have been processed.

In some embodiments, following the formation of the first gate structure 7 and the second gate structure 8, source and drain extension regions may be formed in the semiconductor on insulator layer 4 that is present in the first conductivity type semiconductor device region 10 and the second conductivity type semiconductor device region 20 by ion implantation. In the embodiment, in which the semiconductor devices that are being formed in the first conductivity type semiconductor device region 10 are p-type semiconductor devices, such as p-type field effect transistors, the extension source and drain regions (not shown) are doped to a p-type conductivity. In the embodiments in which the semiconductor devices that are being formed in the second conductivity type semiconductor device 20 are n-type semiconductor devices, the extension source and drain regions (not shown) are doped to an n-type conductivity.

As used herein, "p-type" refers to the addition of impurities to an intrinsic semiconductor that creates deficiencies of valence electrons. The p-type conductivity semiconductor devices are typically produced within Si-containing materials by doping the extension source and drain regions with elements from group III-A of the Periodic Table of Elements. In a silicon-containing semiconductor on insulator layer 4, examples of p-type dopants, i.e., impurities, include but are not limited to boron, aluminum, gallium and indium. As used herein, "n-type" refers to the addition of impurities that contributes free electrons to an intrinsic semiconductor. N-type conductivity semiconductor devices are typically produced within Si-containing material by doping the extension source and drain regions with elements from group V-A of the Periodic Table of Elements. In a silicon containing silicon on insulator layer 4, examples of n-type dopants, i.e., impurities, include but are not limited to, antimony, arsenic and phosphorous. In one embodiment, the concentration of dopant in the extension source and drain regions may range from $1 \times 10^{18}$ atoms/cm$^3$ to $2 \times 10^{21}$ atoms/cm$^3$.

In the embodiments, in which the source and drain extension regions are formed using ion implantation, the diode region 15 is protected during the implantation process by a mask, such as photoresist block mask. The photoresist block mask may be present over the entirety of the diode region 15 during the implantation steps that form the source and drain extension regions. The photoresist block mask is similar to the etch mask that is described above for forming the gate structures 7, 8. Therefore, the method of forming the etch mask for producing the gate structures 7, 8 can provide further details for forming the photoresist block mask that is present over the diode region 15. Photoresist block masks may also be employed to provide for selective doping of the first conductivity type semiconductor device region 10 and the second conductivity type semiconductor device region 20. More specifically, when forming the source and drain extension regions in the first conductivity type semiconductor device region 10, a first photoresist block mask may protect the second conductivity type semiconductor device region 20 and the diode region 15. Thereafter, when forming the source and drain extension regions in the second conductivity type semiconductor device region 20, a second photoresist block mask may protect the first conductivity type semiconductor device region 10 and the diode region 15. In another embodiment, the source and drain extension regions can be formed without ion implantation. In this case, the source and drain extension regions can be formed by epitaxially growing insitu doped raised source and drain regions adjacent to the channel, and performing a thermal anneal to drive dopants, i.e., diffuse dopants, from the raised source and drain regions towards the channel to form the source and drain extension regions.

Figure 3:
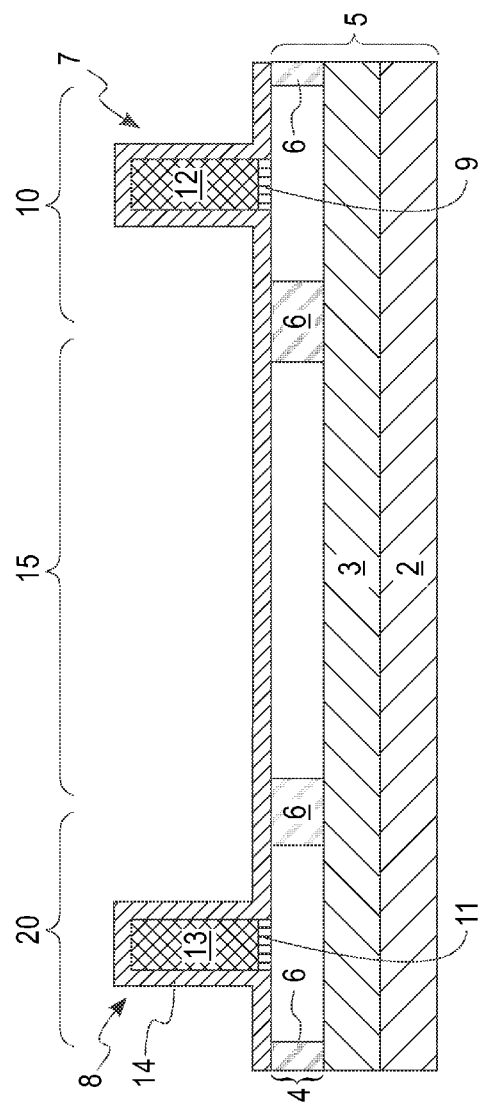
FIG. 3 is a side cross-sectional view depicting one embodiment of forming a dielectric layer on the structure depicted in FIG. 2A.

FIG. 3 depicts one embodiment of forming a dielectric layer 14 on the structure depicted in FIG. 2A. The dielectric layer 14 may be deposited as a single blanket layer over the first conductivity type semiconductor device region 10, the diode region 15 and the second conductivity type semiconductor device region 20. The dielectric layer 14 may be formed on the upper and sidewalls surfaces of the first and second gate structures 7,8. The dielectric layer 14 may be composed of any dielectric material including oxide, nitride and/or oxynitride containing dielectrics. In one example, the dielectric layer 14 may be composed of silicon oxide. In another example, the dielectric layer 14 may be composed of silicon nitride. In one embodiment, the dielectric layer 14 may be formed using a conformal deposition process. The term "conformal" denotes a layer having a thickness that does not deviate from greater than or less than 30% of an average value for the thickness of the layer. In one embodiment, the dielectric layer 14 is formed using a deposition process, such as chemical vapor deposition (CVD). One example of a conformal deposition process is plasma enhanced chemical vapor deposition (PECVD). In another embodiment, the dielectric layer 14 may be formed by a thermal growth process such as, for example, oxidation, nitridation or oxynitridation. In one embodiment, the dielectric layer 14 has a thickness that ranges from 1 nm to 10 nm. In another embodiment, each dielectric layer 14 has a thickness that ranges from 2 nm to 5 nm.

FIGS. 4A and 4B depict one embodiment of etching the dielectric layer 14 to form at least one first gate sidewall spacer 16 adjacent to the first gate structure 7 in the first conductivity type semiconductor device region 10, a plurality of dielectric strips 17 in the diode region 15, and a remaining portion of the dielectric layer 18 on the second conductivity type semiconductor device region 20. Prior to etching the dielectric layer 14, a first mask 19 can be formed over the entirety of the second conductivity semiconductor device region 20, and the portions of the dielectric layer 14 that provide the plurality of dielectric strips 17 in the diode region 15. The first mask 19 may be comprised of a photoresist. Specifically, the first mask 19 may be produced by applying a photoresist layer to the dielectric layer 14, exposing the photoresist layer to a pattern of radiation, and then developing the pattern into the photoresist utilizing a resist developer. Once the patterning of the photoresist layer is completed, the sections covered by the portions of the photoresist layer that provide the first mask 19 are protected, while the exposed regions are removed using a selective etching process that removes the unprotected regions selectively to the first mask 9.

In one embodiment, the etch process that removes the exposed portions of the dielectric layer 14 is an anisotropic etch process that is selective to the first mask 19. As used herein, the term "selective" in reference to a material removal process denotes that the rate of material removal for a first material is greater than the rate of removal for at least another material of the structure to which the material removal process is being applied. In some examples, the selectivity may be greater than 10:1. In other embodiments, the selectivity may be greater than 100:1. In one embodiment, the etch process removes exposed portions of a dielectric layer 14 composed of silicon nitride selectively to a first etch mask 19. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

The anisotropic etch process typically removes the horizontal portions of the dielectric layer 14, such as the portions of the dielectric layer 14 that are present on the upper surface of the gate structures 7, 8, of the dielectric material 14 faster than the vertical portions of the dielectric layer 14, such as the portions of the dielectric layer 14 that are present on the sidewalls surfaces of the gate structures 7, 8. In some embodiments, this etch differential provides the at least one first gate sidewall spacer 16 that is present on the sidewalls of the first gate structure 7. In one embodiment, the at least one first gate sidewall spacer 16 has a greatest width, e.g., width at the base of the at least one first dielectric spacer 16, that ranges from 1.0 nm to 50.0 nm. In another embodiment, the at least one first gate sidewall spacer 16 has a greatest width that ranges from 10.0 nm to 20.0 nm.

The etch process that forms the at least one first gate sidewall spacer 16, also simultaneously forms dielectric strips 17 that are present in the diode region 15. The dielectric strips 17 are present over a portion of the semiconductor on insulator layer 4 in the diode region 15, in which a portion of the dielectric strips 17 extend onto the isolation region 6, as depicted in FIG. 5B. In some embodiments, the length of the dielectric strips 17 does not cover the entire length L1 of the SOI layer 4 of the diode region 15. A portion of the length L1 of the SOI layer 4 is not covered by the diode region 15 to allow for enhanced interconnectivity of the later formed first conductivity type semiconductor material 21 that is epitaxially formed on the exposed portions of the SOI layer 4 within the diode region 15 that are not covered by the dielectric strip 17, as depicted in FIG. 5A. The etch process that forms the dielectric strips 17 and the at least one first gate sidewall spacer 16 does not etch the portion of the dielectric layer 14 that is present in the second conductivity type semiconductor device region 20, because the second conductivity type semiconductor device region 20 is protected by the first mask 19, as previously depicted in FIGS. 4A and 4B.

FIGS. 5A and 5B depict forming a first portion of a first conductivity semiconductor material 21 on the semiconductor on insulator layer 4 on opposing sides of the first gate structure 7 in the first conductivity type semiconductor device region 10, and forming a second portion of the first conductivity semiconductor material 22 on the semiconductor on insulator layer 4 in the diode region 15. The first conductivity semiconductor material 21, 22 is not formed in the second conductivity type semiconductor device region 20, because the second conductivity semiconductor device region type 20 is protected by the remaining portion of the dielectric layer 18. The first portion of the first conductivity semiconductor material 21 that is present in the first conductivity type semiconductor device region 10 may provide the raised source region and the raised drain region of the semiconductor device that is present in the first conductivity type semiconductor device region 10, and the second portion of the first conductivity semiconductor material 22 that is present in the diode region 15 may provide the first doped layer of a semiconductor diode.

In one embodiment, the first conductivity semiconductor material 21, 22 may be a silicon-containing material, such as silicon (Si), single crystal silicon, multi-crystalline silicon, polycrystalline silicon, silicon germanium (SiGe), single crystal silicon germanium, multi-crystalline silicon germanium, polycrystalline silicon germanium and silicon doped with carbon. In other examples, the first conductivity semiconductor material 21, 22, may be composed of other semiconductor materials, such as germanium and compound semiconductors, e.g., III-V semiconductor materials. The first conductivity semiconductor material 21, 22 is typically formed using an epitaxial growth or epitaxial deposition process.

"Epitaxial growth and/or deposition" means the growth of a semiconductor material on a deposition surface of a semiconductor material, in which the semiconductor material being grown has the same crystalline characteristics as the semiconductor material of the deposition surface. The term "epitaxial" denotes a material that has been formed by epitaxial growth, in which the deposited material has the same crystalline characteristics as the semiconductor material on which the material is present. In some embodiments, when the chemical reactants are controlled and the system parameters set correctly, the depositing atoms arrive at the surface of the semiconductor on insulator layer 4 with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of polysilicon instead of single crystal silicon. The temperature for epitaxial deposition typically ranges from 550° C. to 900° C. Although higher temperature typically results in faster deposition, the faster deposition may result in crystal defects and film cracking.

Referring to FIGS. 5A and 5B, the first portion of the first conductivity semiconductor material 21 that is formed on the exposed surface of the semiconductor on layer 4 in the first conductivity type semiconductor device region 10 provides the raised source and drain regions. As used herein, the term "raised" in combination with source and/or drain denotes that the source and/or drain region is formed on the semiconductor on insulator layer 4 that provides the upper surface of the extremely thin semiconductor on insulator substrate 5. The raise source and drain regions typically have the same conductivity type, i.e., n-type or p-type, as the extension source and drain regions. The raised source and drain regions may be composed of an epitaxially formed material that is doped using in-situ doping processes, or is doped by ion implantation, or is doped by gas phase doping. In one example, the raised source and drain regions may be provided by the first portion of the first conductivity semiconductor material 21 that is composed of silicon having a p-type conductivity, in which the concentration of dopant in the first conductivity semiconductor material 21 may range from $1 \times 10^{18}$ atoms/cm$^3$ to $2 \times 10^{21}$ atoms/cm$^3$. The raised source region in combination with the extension source region provide the source region of the semiconductor device, e.g., field effect transistor. As used herein, the term "source" is a doped region in the semiconductor device, in which majority carriers are flowing into the channel region of the semiconductor device. The raised drain region in combination with the extension drain region provide the drain region of the semiconductor device, e.g., field effect transistor. The term "drain" means a doped region in semiconductor device located at the end of the channel, in which carriers are flowing out of the semiconductor device through the drain. As used herein, the term "channel portion" is the region in the semiconductor on insulator layer that is underlying the gate structure, wherein the channel portion is between the extension source region and extension drain region of the semiconductor device that becomes conductive when the semiconductor device is turned on. Typically, the first portion of the first conductivity semiconductor material 21 that provides the raised source and drain regions has a thickness T2 that ranges from 5 nm to 50 nm. In another embodiment, the first portion of the first conductivity semiconductor material 21 that provides the raised source and drain regions has a thickness T2 that ranges from 15 nm to 25 nm.

In some embodiments, in which the field effect transistor that is formed in the first conductivity type semiconductor device region 10 has a p-type conductivity, the composition of the first portion of the first conductivity semiconductor material 21 may be selected to be silicon germanium. Silicon germanium when employed as a raised source region and a raised drain region can induce a compressive stress in the underlying channel region of the field effect transistor, which can increase carrier mobility, i.e., hole mobility, for field effect transistors having a p-type conductivity.

Referring to FIGS. 5A and 5B, the second portion of the first conductivity semiconductor material 22 that is formed on the exposed portions of the semiconductor on insulator layer 4 in the diode region 15 is formed simultaneously with the first portion of the first conductivity semiconductor material 21 that provides the raised source and drain regions in the first conductivity type semiconductor device region 10. The second portion of the first conductivity semiconductor material 22 provides at least a portion of the first doped layer for the semiconductor diode that is formed in the diode region 15. The second portion of the first conductivity semiconductor material 22 may be present on the entire exposed surface of the semiconductor on insulator layer 4 in the diode region 15 that is not covered by the dielectric strips 15 that are present in the diode region 15. At least one surface of the second portion of the first conductivity semiconductor material 22 is processed to provide the contact surface to the second portion of the first conductivity semiconductor material 22 so that the second portion of the first conductivity semiconductor material 22 may be contacted from the upper surface of the semiconductor diode that is formed in the diode region 15. For example, referring to FIG. 5B, the second portion of the first conductivity semiconductor material 22 may include a separating portion 23 (also referred to as a protrusion) that is formed between adjacent dielectric strips 17 and a connecting portion 24 that is in contact with each of the separating portions 23 of the second portion of the first conductivity semiconductor material 22. The protrusion 23 of the first conductivity semiconductor material 22 may have a length L2 ranging from 20 nm to 5000 nm. In another embodiment, the length L2 of the protrusion 23 of the first conductivity semiconductor material 22 may range from 50 nm to 1000 nm. The protrusion 23 of the first conductivity semiconductor material 22 may have a width W1 ranging from 20 nm to 2000 nm. In another embodiment, the width W1 of the protrusion 23 of the first conductivity semiconductor material 22 may range from 50 nm to 500 nm.

The second portion of the first conductivity semiconductor material 22 is formed simultaneously with the first portion of the first conductivity semiconductor material 21. The composition and thickness for the second portion of the first conductivity semiconductor material 22 may be the same as the first portion of the first conductivity semiconductor material 21. Therefore, the above description of the composition, thickness and method of making the first portion of the first conductivity semiconductor material 22 is suitable for providing the details for making the second portion of the first conductivity semiconductor material 22. For example, thickness T3 of the second portion of the first conductivity semiconductor material 22 may range from 5 nm to 50 nm. In another embodiment, the thickness T3 of the second portion of the first conductivity semiconductor material 22 may range from 15 nm to 25 nm. In one embodiment, the thickness for the second portion of the first conductivity semiconductor material 22 may be different than the thickness for the first portion of the first conductivity semiconductor material 21.

In some embodiments in which the first and second portions of the first conductivity semiconductor material 21, 22 are composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which the first and second portions of the first conductivity semiconductor material 21, 22 are composed of germanium, the germanium gas source for epitaxial deposition may be selected from the group consisting of germane (GeH$_4$), digermane (Ge$_2$H$_6$), halogermane, dichlorogermane, trichlorogermane, tetrachlorogermane and combinations thereof. In some embodiments in which the first and second portions of the first conductivity semiconductor material 21, 22 are composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

Referring to FIGS. 5A and 5B, the epitaxial deposition process does not form the first conductivity semiconductor material on the second conductivity type semiconductor device region 20, because the remaining portion of the dielectric layer 18 is covering the second conductivity type semiconductor device region 20. Similarly, although not depicted in the supplied figures, the first conductivity semiconductor material is not formed on the upper surface of the gate structure 7 that is present in the first conductivity type semiconductor device region 10, because a dielectric cap may be present over the at least one gate conductor 12.

Figure 6A:
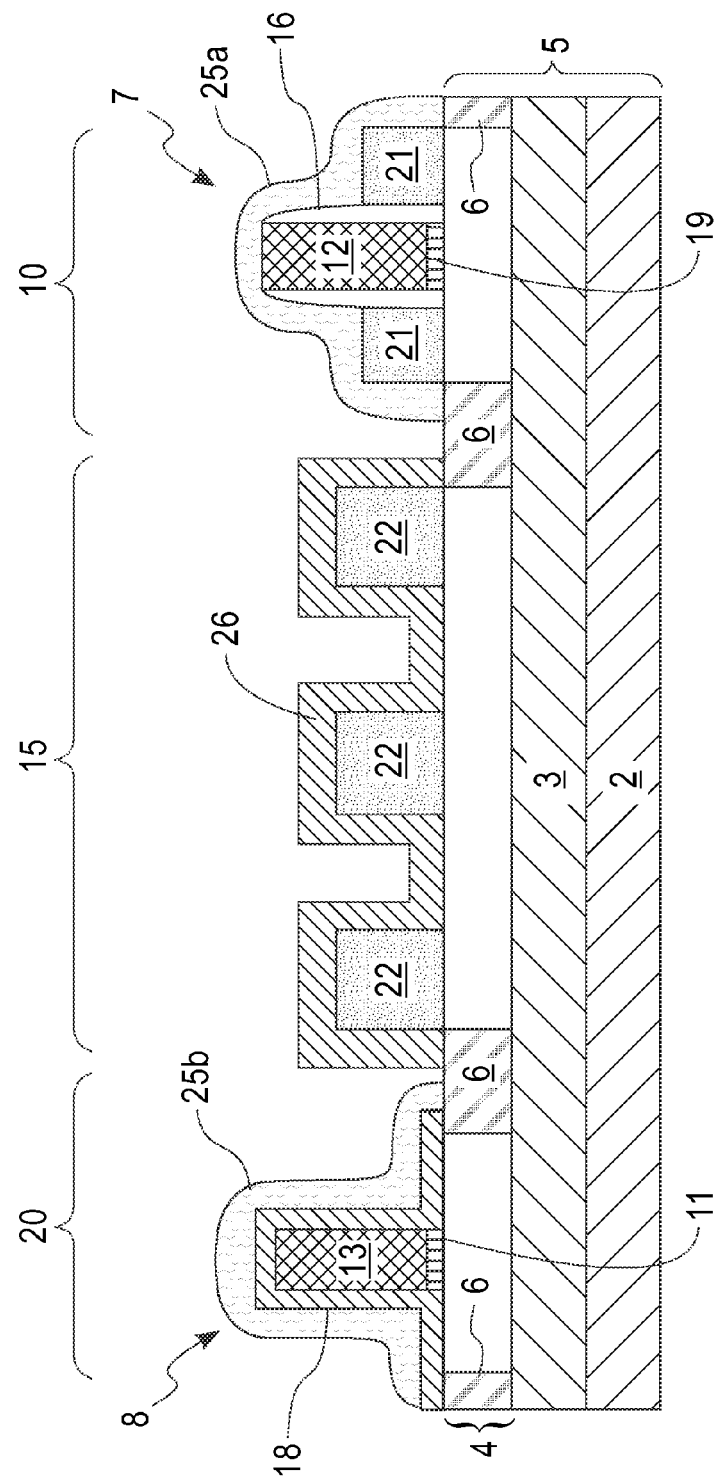
FIG. 6A is a side cross-sectional view depicting forming a first hard mask covering the first conductivity semiconductor device region and the second conductivity type semiconductor device region, and forming an intrinsic semiconductor material on the first conductivity semiconductor material in the diode region, in accordance with one embodiment of the present disclosure.
Figure 6B:
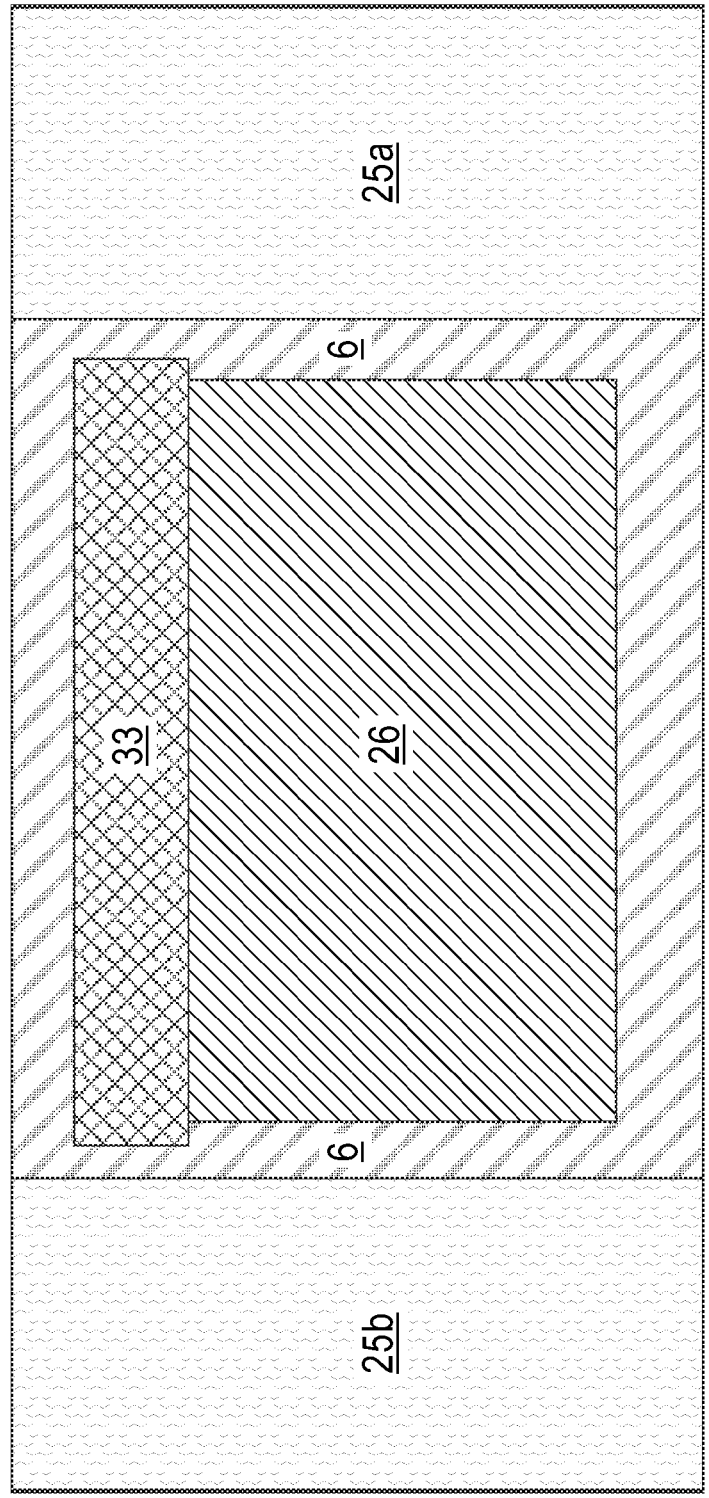
FIG. 6B is a top down view of the structure depicted in FIG. 6A.

FIGS. 6A and 6B depict forming a second mask 25a, 25b covering the first conductivity type semiconductor device region 10 and the second conductivity type semiconductor device region 20, and forming an intrinsic semiconductor material 26 on the first conductivity type semiconductor material 22 that is present in the diode region 15. In some embodiments, forming the second mask 25a, 25b may include forming a hard mask of a dielectric material, such as an oxide, nitride or oxynitride material. In one example, the second mask 25a, 25b may be composed of silicon oxide. In another example, the second mask 25a, 25b may be composed of silicon nitride. Forming a hard mask for the second mask 25a, 25b may include depositing a blanket layer of the hard mask material, e.g., oxide, nitride, or oxynitride material layer, over the entire extremely thin semiconductor on insulator substrate 5 including the first conductivity type semiconductor device region 10, the diode region 15, and the second conductivity type semiconductor device region 20. The blanket layer of the hard mask material may be depositing using a chemical vapor deposition method, such as plasma enhanced chemical vapor deposition. Following deposition of the blanket layer of the hard mask material, a photoresist mask may be formed protecting the portions of the blanket layer of the hard mask material that are present in the first conductivity type semiconductor device region 10 and the second conductivity type semiconductor device region 20 leaving the portion of the blanket layer of the hard mask material that is present over the diode region 15 exposed. The exposed portion of the blanket layer of the hard mask material that is present over the diode region 15 may be removed by an etch that is selective to the photoresist mask protecting the portions of the blanket layer of the hard mask material that are present over the first conductivity type semiconductor device region 10 and the second conductivity type semiconductor device region 20. The photoresist mask may then be removed. After the portion of the blanket layer of the hard mask material is removed from the diode region 15, the remaining portions of the blanket layer of the hard mask material provide the second mask 25a, 25b.

The intrinsic semiconductor layer 26 may be epitaxially deposited on the first conductivity type semiconductor material 22 that is present in the exposed diode region 15, wherein the second mask 25a, 25b obstructs the epitaxial deposition process from forming the intrinsic semiconductor material in the first conductivity type semiconductor device region 10 and the second conductivity type semiconductor device region 20. The term "intrinsic semiconductor", also called an undoped semiconductor or i-type semiconductor, is a substantially pure semiconductor without any significant dopant species present. The number of charge carriers in the intrinsic semiconductor is determined by the properties of the material itself instead of the amount of impurities, i.e., dopants. Typically, in intrinsic semiconductors the number of excited electrons and the number of holes are equal (n=p). The intrinsic semiconductor layer 26 may be composed of a silicon containing semiconductor including, but not limited to, silicon (Si), germanium (Ge), silicon germanium (SiGe) and compound semiconductors, such as type III-V semiconductors. With the exception of not being doped with an n-type or p-type dopant, the epitaxial deposition process for forming the intrinsic semiconductor layer 26 is similar to the epitaxial deposition process for forming the first conductivity type semiconductor material 21, 22. Therefore, the above description of epitaxially depositing the first conductivity type semiconductor material 21, 22 is suitable for epitaxially forming the intrinsic semiconductor layer 26. In one embodiment, the intrinsic semiconductor layer 26 has a thickness ranging from 1 nm to 10 nm. In another embodiment, the intrinsic semiconductor layer 26 has a thickness ranging from 2 nm to 5 nm.

Referring to FIG. 6B, a mask 27, such as a photoresist mask or a hard mask, may be present over a portion of the connecting portion 24 of the first conductivity type semiconductor material 22 that is present in the diode region 15 during the deposition of the intrinsic semiconductor layer 26. The mask 27 obstructs the epitaxially formed intrinsic semiconductor layer 26 from being formed on the portion of the first conductivity type semiconductor material 22 that is being covered by the mask 27.

The intrinsic semiconductor layer 26 is optional, and may be omitted from the semiconductor diode that is formed in the diode region 15. In some embodiments, the intrinsic semiconductor layer 26 may be employed to provide a low dopant concentration at the interface between the first conductivity type semiconductor material 21 and the subsequently formed second conductivity type semiconductor material that are both present in the diode region 15. In the embodiments in which the intrinsic semiconductor layer 26 is omitted, the first conductivity type semiconductor material 21 and the subsequently formed second conductivity type semiconductor material that are present in the diode region 15 may be in direct contact. The term "direct contact" means that a first element, such as a first structure, and a second element, such as a second structure, are connected without any intermediary conducting, insulating or semiconductor layers at the interface of the two elements.

Figure 7A:
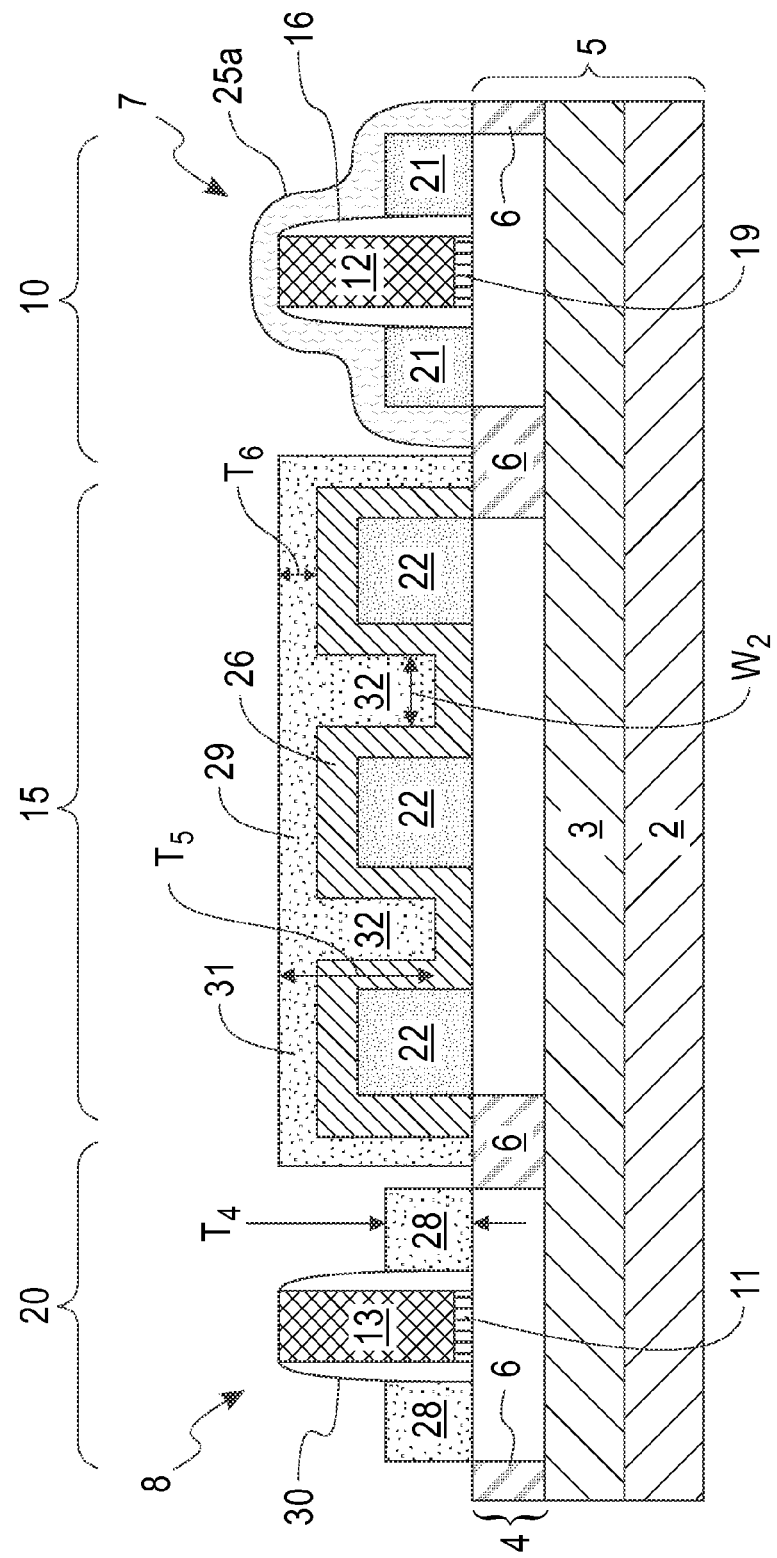
FIG. 7A is a side cross-sectional view depicting forming a second conductivity semiconductor material on the semiconductor on insulator layer on opposing sides of the second gate structure that is present in the second conductivity type semiconductor device region and on the intrinsic semiconductor material in the diode region, in accordance with one embodiment of the present disclosure.
Figure 7B:
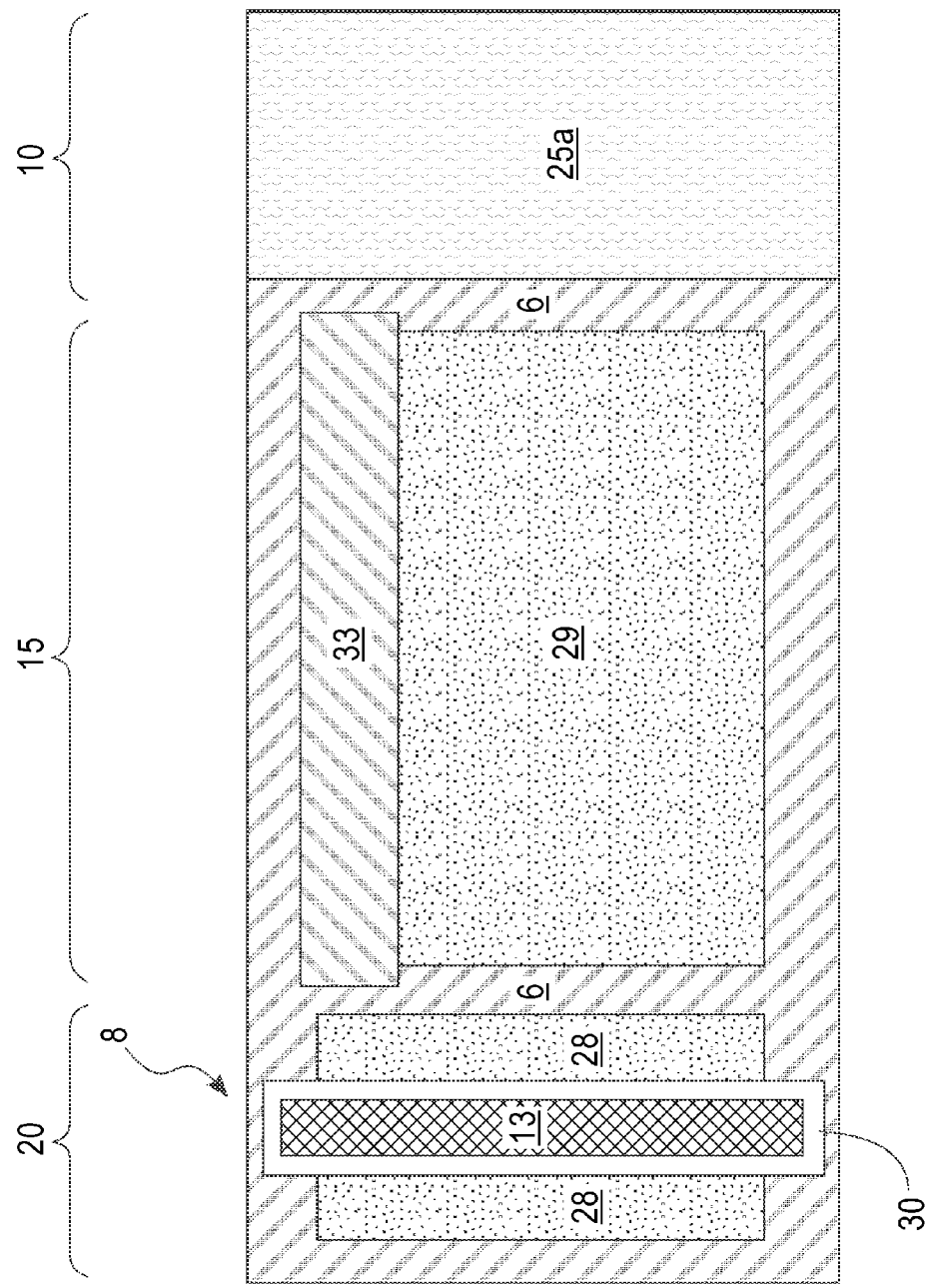
FIG. 7B is a top down view of the structure depicted in FIG. 7A.

FIGS. 7A and 7B depict forming a second conductivity semiconductor material 28, 29 on the semiconductor on insulator layer 4 on opposing sides of the second gate structure 8 that is present in the second conductivity type semiconductor device region 20 and on the optional intrinsic semiconductor material 26 that is present in the diode region 15. Before forming the second conductivity semiconductor material 28, 29, the remaining portion of the dielectric layer 18 can be etched to provide at least one second gate sidewall spacer 30 that is present on the sidewalls of the second gate structure 8. Etching the remaining portion of the dielectric layer 18 that is present in the second conductivity type semiconductor device region 20 to provide the at least one second gate sidewall spacer 30 may begin with removing the portion of the second mask 25b that is present over the second conductivity type semiconductor device region 20 with an etch process, such as a selective etch process. In some embodiments, the diode region 15 and the first conductivity type semiconductor device region 10 may be protected by as mask, such as a photoresist mask or hard mask, during the etch process for removing the portion of the second mask 25b that is present over the second conductivity type semiconductor device region 20. In some embodiments, the portion of the second mask 25a that is present over the first conductivity type semiconductor device region 10 remains during the process sequence for forming the second conductivity semiconductor material 28, 29.

The exposed remaining portion of the dielectric layer 18 may then be etched using an anisotropic etch process to form the at least one second gate sidewall spacer 30. The method of forming and the dimensions of the at least one second gate sidewall spacer 30 are similar to the method of forming and the dimensions of the at least one first gate sidewall spacer 16 that is described above with reference to FIGS. 4A and 4B. Therefore, the description of the at least one first gate sidewall spacer 16 that is made above with reference to FIGS. 4A and 4B is suitable for the method of forming and the dimensions of the at least one second gate sidewall spacer 30 that is depicted in FIGS. 7A and 7B.

In some embodiments and, following the formation of the at least one second gate sidewall spacer 30 on the sidewalls of the second gate structure 8, the second conductivity semiconductor material 28, 29 is epitaxially deposited on the exposed semiconductor surfaces of the second conductivity type semiconductor device region 20 and the diode region 15, while the remaining portion of the second mask 25b obstructs the second conductivity semiconductor material 28, 29 from being formed on the first conductivity type semiconductor device region 10. The portion of the second conductivity semiconductor material 28 that is present in the second conductivity type semiconductor device region 20 may provide the raised source region and the raised drain region of the semiconductor device that is present in the second conductivity type semiconductor device region 20, and the portion of the second conductivity semiconductor material 29 that is present in the diode region 15 may provide the second doped layer of the semiconductor diode. The conductivity type of the second conductivity semiconductor material 28, 29 is opposite the conductivity type of the first conductivity semiconductor material 21, 22. For example, when the first conductivity semiconductor material 21, 22 is doped with p-type dopants, i.e., has a p-type conductivity, the second conductivity semiconductor material 28, 29 is doped with n-type dopants, i.e., has an n-type conductivity.

In one embodiment, the second conductivity semiconductor material 28, 29 may be a silicon-containing material, such as silicon (Si), single crystal silicon, multi-crystalline silicon, polycrystalline silicon, silicon germanium (SiGe), single crystal silicon germanium, multi-crystalline silicon germanium, polycrystalline silicon germanium and silicon doped with carbon. In other examples, the second conductivity semiconductor material 28, 29 may be composed of other semiconductor materials, such as germanium and compound semiconductors, e.g., III-V semiconductor materials. Precursors for epitaxially depositing the aforementioned semiconductor compositions for the second conductivity semiconductor material 28, 29 have been described above for forming the first conductivity semiconductor material 21, 22.

Referring to FIGS. 7A and 7B, the first portion of the first conductivity semiconductor material 28 that is formed on the exposed surface of the semiconductor on layer 4 in the second conductivity type semiconductor device region 20 provides the raised source and drain regions of the semiconductor device, e.g., field effect transistor, that is present in the second conductivity type semiconductor device region 20. In one example, the raised source and drain regions may be provided by the first portion of the second conductivity semiconductor material 28 is composed of silicon having an n-type conductivity, in which the concentration of dopant in the second conductivity semiconductor material 28 may range from $1 \times 10^{18}$ atoms/cm$^3$ to $2 \times 10^{21}$ atoms/cm$^3$. Typically, the first portion of the second conductivity semiconductor material 28 that provides the raised source and drain regions has a thickness T4 that range from 5 nm to 50 nm. In another embodiment, the first portion of the first conductivity semiconductor material 28 that provides the raised source and drain regions has a thickness T4 that ranges from 15 nm to 25 nm.

In some embodiments in which the field effect transistor that is formed in the second conductivity type semiconductor device region 20 has an n-type conductivity, the composition of the first portion of the second conductivity semiconductor material 28 may be silicon doped with carbon (Si:C). Silicon doped with carbon when employed as a raised source region and a raised drain region can induce a tensile stress in the underlying channel region of the field effect transistor, which can increase carrier mobility, i.e., electron mobility, for field effect transistors having an n-type conductivity.

Referring to FIGS. 7A and 7B, the second portion of the second conductivity semiconductor material 29 that is formed on the intrinsic semiconductor layer 26 in the diode region 15 is formed simultaneously with the first portion of the first conductivity semiconductor material 28 that provides the raised source and drain regions in the second conductivity type semiconductor device region 20. Therefore, the composition for the second portion of the second conductivity semiconductor material 29 may be the same as the first portion of the second conductivity semiconductor material 28. As such, the above description of the composition, and method of making the first portion of the first conductivity semiconductor material 28 is suitable for providing the details for making the second portion of the first conductivity semiconductor material 29. For example, the second portion of the second conductivity semiconductor material 29 may be silicon or silicon germanium, and may have a concentration of n-type dopant ranging from $1 \times 10^{18}$ atoms/cm$^3$ to $2 \times 10^{21}$ atoms/cm$^3$.

The second portion of the second conductivity semiconductor material 29 provides at least a portion of the second doped layer for the semiconductor diode that is formed in the diode region 15. Referring to FIG. 7A, the second portion of the second conductivity semiconductor material 29 may include a strip portion 32 (also referred to as a protrusion) that is formed over the portion of the semiconductor on insulator layer 4 that the strip dielectric had previously covered. The strip portion 32, i.e., protrusion, of the second conductivity semiconductor material 29 is also present between the separated portions, i.e., protrusions, of the first conductivity semiconductor material 22 that provides the first doped layer of the semiconductor diode. The strip portions 32, i.e., protrusions, of the second conductivity semiconductor material 29 that provides the second doped layer of the diode may be interconnected by a connecting portion 31 of the second conductivity semiconductor material 29. In one embodiment, the strip portions 32, i.e., protrusions, of the second conductivity semiconductor material 29 may have a thickness T5 ranging from 30 nm to 500 nm. In another embodiment, the strip portions 32, i.e., protrusions, of the second conductivity semiconductor material 29 may have a thickness T5 ranging from 100 nm to 200 nm. In one embodiment, the strip portions 32, i.e., protrusions, of the second conductivity semiconductor material 29 may have a width W2 ranging from 20 nm to 500 nm. In another embodiment, the strip portions 32, i.e., protrusions, of the second conductivity semiconductor material 29 may have a width W2 ranging from 40 nm to 200 nm. The connecting portion 31 of the of the second conductivity semiconductor material 29 may have a thickness T6 ranging from 10 nm to 500 nm. In another embodiment, the connecting portion 31 of the of the second conductivity semiconductor material 29 may have a thickness T6 ranging from 30 nm to 200 nm.

Referring to FIGS. 7A and 7B, the epitaxial deposition process does not form the second conductivity semiconductor material 28, 29 on the first conductivity type semiconductor device region 10, because the remaining portion of the second mask 25a is covering the first conductivity type semiconductor device region 10. Similarly, although not depicted in the supplied figures, the second conductivity semiconductor material 28, 29 is not formed on the upper surface of the gate structure 8 that is present in the second conductivity type semiconductor device region 20, because a dielectric cap may be present over the at least one gate conductor 13. Referring to FIG. 7B, in some embodiments, prior to forming the second conductivity semiconductor material 28, 29, a mask 33, such as a photoresist mask or a hard mask, may be present over a portion of an upper surface of the diode region 15 that includes an exposed portion of the intrinsic semiconductor layer 26 and an exposed portion of the first conductivity semiconductor material 22 that is present in the diode region 15 during the deposition of the second conductivity semiconductor material 28, 29.

FIGS. 7A and 7B depict one embodiment of the present disclosure that includes an intrinsic semiconductor layer 26. In the embodiments in which the intrinsic semiconductor layer 26 is omitted, the second portion of the second conductivity semiconductor material 29 may be epitaxially deposited directly on the second portion of the first conductivity semiconductor material 22 that is present in the diode region 15. Also by omitting the intrinsic semiconductor layer 26, the portion of the second mask 25b that is present over the second conductivity type semiconductor device region 20 may be also be omitted.

Figure 8A:
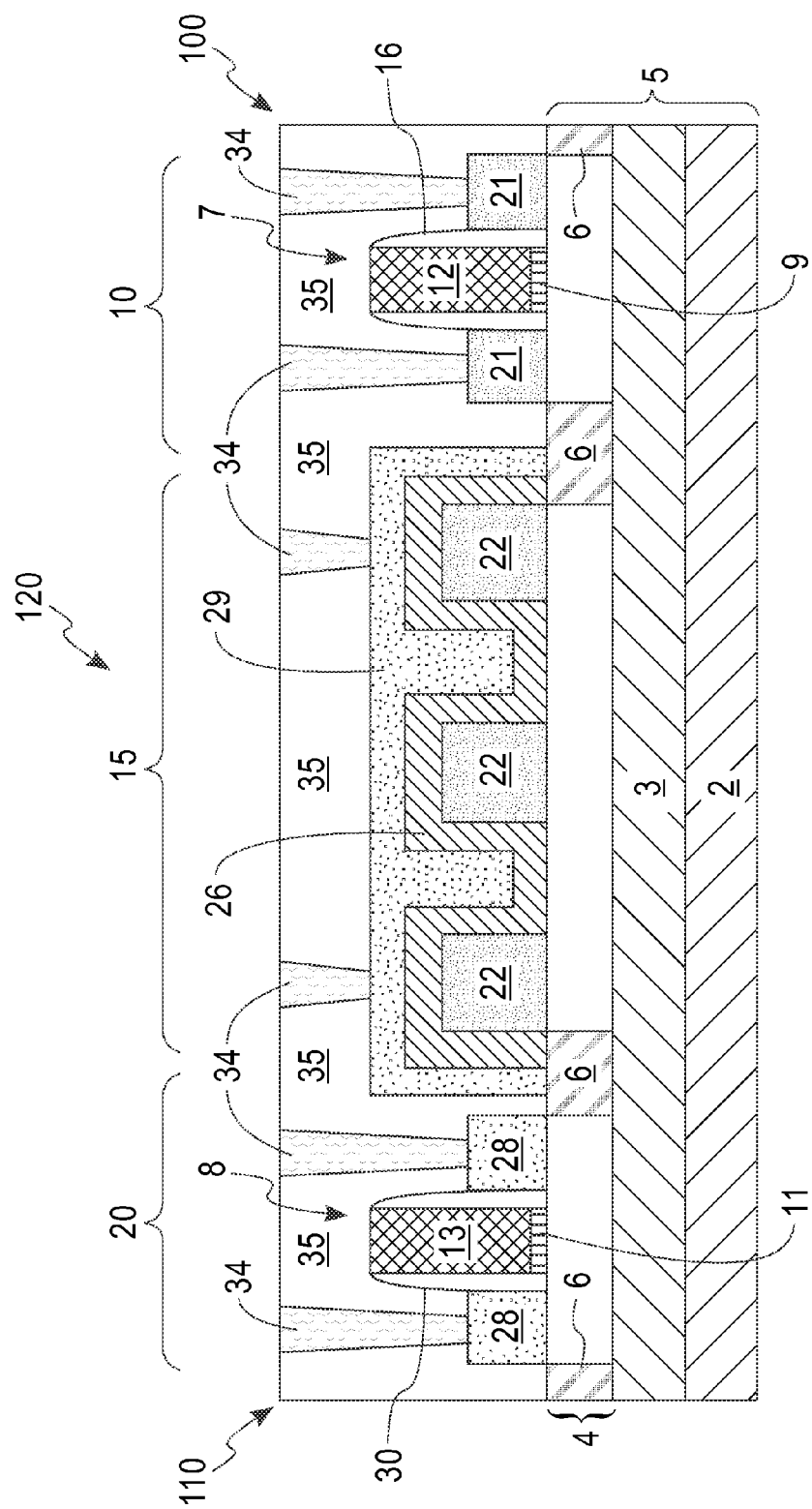
FIG. 8A is a side cross-sectional view of forming contacts to the semiconductor devices and the diodes, in accordance with one embodiment of the present disclosure.
Figure 8B:
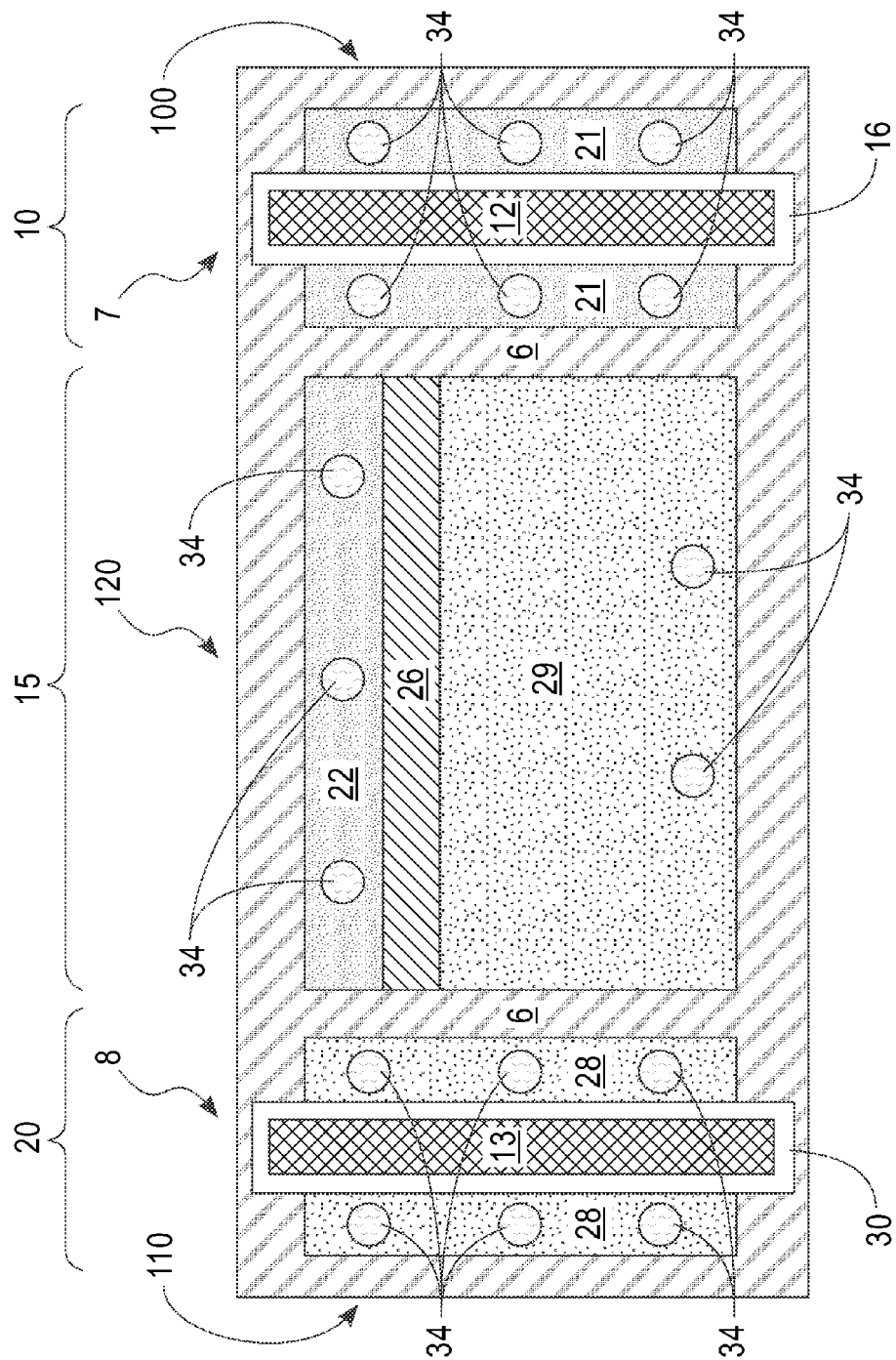
FIG. 8B is a top down view of the structure depicted in FIG. 8A.

FIGS. 8A and 8B depict forming contacts 34 to the first conductivity type semiconductor device 100, e.g., first conductivity type field effect transistor, in the first type conductivity semiconductor device region 10, the semiconductor diode 120 in the diode region 15, and the first conductivity type semiconductor device 100, e.g., first conductivity type field effect transistor, in the first type conductivity semiconductor device region 10. The contacts 34 may be formed through an interlevel dielectric layer 35 that is blanket deposited over the extremely thin semiconductor on insulator substrate 5. The interlevel dielectric layer 35 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer 35 include any of the aforementioned materials in porous form, or in a form that changes during processing to or from being porous and/or permeable to being non-porous and/or non-permeable.

The interlevel dielectric layer 35 may then patterned and etched to form via holes to a portion of the first doped layer, i.e., first conductivity semiconductor material 22, and the second doped layer, i.e., second conductivity semiconductor material 29, of the semiconductor diode 120; the raised source region and the raised drain region, i.e., first conductivity semiconductor material 21, of the first conductivity type semiconductor device 100; and the raised source region and the raised drain region, i.e., second conductivity semiconductor material 28, of the second conductivity type semiconductor device 110. Following via formation, the contacts 34 are formed by depositing a conductive metal into the via holes using deposition methods, such as CVD, sputtering or plating. The conductive metal may include, but is not limited to: tungsten, copper, aluminum, silver, gold and alloys thereof.

FIGS. 8A and 8B depict one embodiment of an electrical device including a first conductivity type semiconductor device 100 present in the first conductivity type semiconductor device region 10 of the extremely thin semiconductor on insulator substrate 5, and a second conductivity type semiconductor device 110 present in the second conductivity type semiconductor device region 20 of the extremely thin semiconductor on insulator substrate 5. The electrical device also includes a semiconductor diode 120 that is present within a diode region 15 of the extremely thin semiconductor on insulator substrate 5 that includes a first doped layer of a first conductivity semiconductor material 22 that is present on the semiconductor on insulator layer 4 of the extremely thin semiconductor on insulator substrate 5. The first doped layer includes a first plurality of protrusions 23 extending from a first connecting base portion 22, which is more clearly depicted in FIG. 5B. Referring to FIGS. 8A and 8B, the semiconductor diode 120 further includes a second doped layer of the second conductivity semiconductor material 29 that is present over the first doped layer. The conductivity type of the second doped layer is opposite the conductivity type of the first doped layer for the semiconductor diode. The second doped layer includes a second plurality of protrusions 32 extending from a second connecting base portion 31, which is more clearly depicted in FIG. 7A. The second plurality of protrusions 32 is present between and separating the first plurality of protrusions 23, as illustrated by FIGS. 5B, 7A, 8A and 8B.

The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. For example, a second doped layer of the second conductivity semiconductor material 29 that is present over the first doped layer of the first conductivity semiconductor material 22 means that an intermediate layer, such as an intrinsic semiconductor layer 26 may be present between and separating the second conductivity semiconductor material 29 and the first conductivity semiconductor material 22 that is present in the diode region 15. In some embodiments, the second doped layer of the second conductivity semiconductor material 29 is in direct contact with the first doped layer of the first conductivity semiconductor material 22 in the diode region 15.

In the embodiment that is depicted in FIGS. 8A and 8B, the semiconductor devices, e.g., field effect transistors, are planar. The term "planar" as used to describe a semiconductor device, such as a field effect transistor, denotes that the direction of charge carriers from the source region to the drain region of the semiconductor device is along a plane that is parallel to the upper surface of the substrate, wherein the gate structure is present on the upper surface of the substrate. Typically, in a planar device at least a portion of the source region and the drain region are present within the upper surface of the substrate, e.g., the semiconductor on insulator layer 4 of the extremely thin semiconductor on insulator substrate 5. In one embodiment, the first conductivity is a p-type conductivity and the second conductivity is an n-type conductivity. In this example, the first doped layer of the semiconductor diode, i.e., first conductivity semiconductor material 21, has a p-type conductivity and the second doped layer of the semiconductor diode, i.e., second conductivity semiconductor material 22, has an n-type conductivity. The present disclosure is not limited only this embodiment, as the first doped layer of the semiconductor diode, i.e., first conductivity semiconductor material 21, may have an n-type conductivity and the second doped layer of the semiconductor diode, i.e., second conductivity semiconductor material 22, may have a p-type conductivity.

In another embodiment, a method of forming an electrical device is provided that forms fin field effect transistors (finFETs) and semiconductor diodes on the same semiconductor on insulator substrate 5a, as depicted in FIGS. 9-13C. A fin field effect transistor is a field effect transistor including a channel located in a fin structure. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. FinFETs employ vertical surfaces of semiconductor fins to effectively increase a device area without increasing the physical layout area of the device. Fin-based devices are compatible with fully depleted mode operation if the lateral width of the fin is thin enough.

Figure 9:
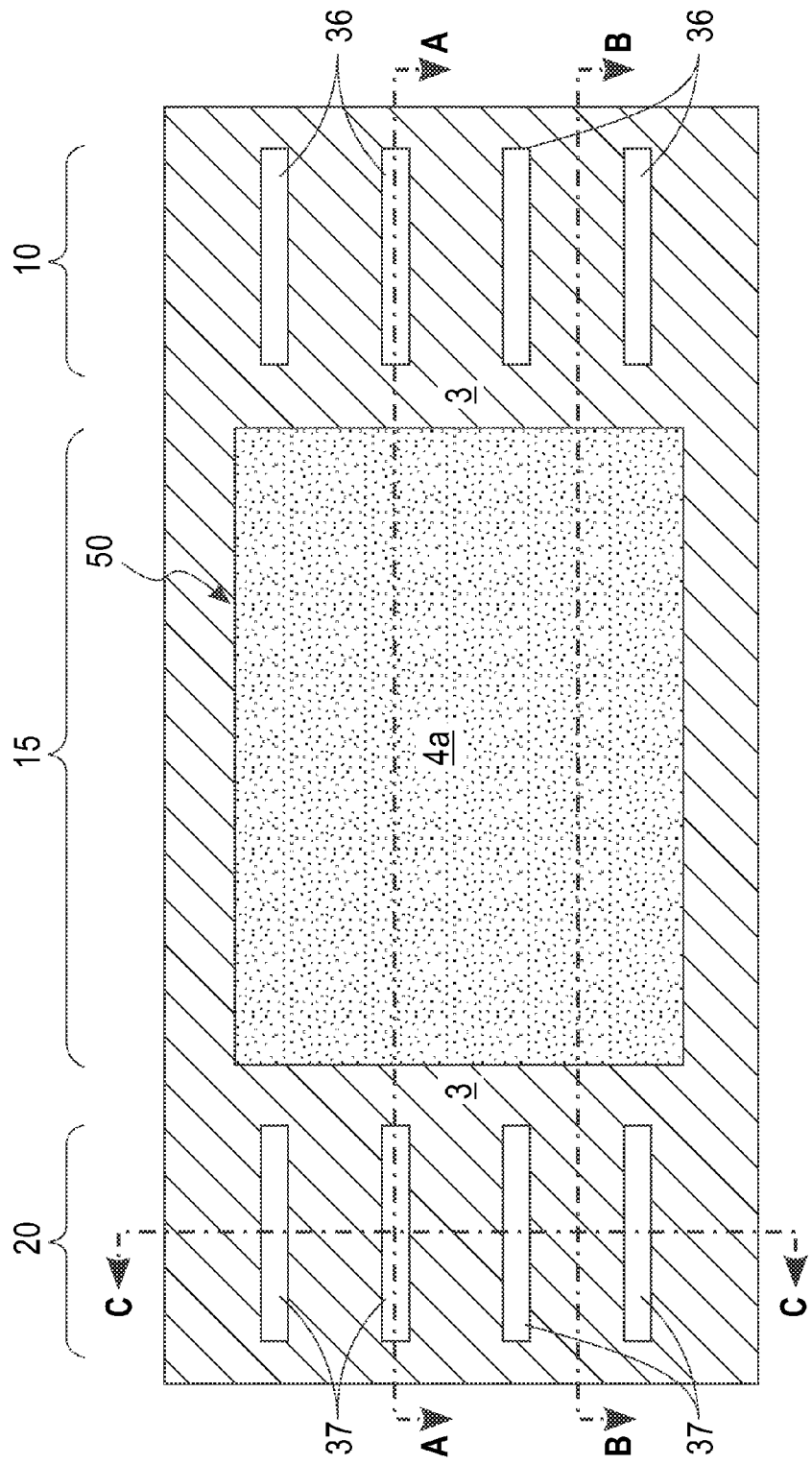
FIG. 9 is a top down view of forming a plurality of fin structures from a semiconductor on insulator substrate, in which the fin structures are separated from a diode region of the semiconductor on insulator substrate, in accordance with one embodiment of the present disclosure.

FIG. 9 depicts an initial structure used in one embodiment of a method for forming an electrical device including a diode region 15, a first conductivity type semiconductor device region 10, and a second conductivity type semiconductor device region 20, in which the semiconductor devices that are present in the first conductivity type semiconductor device region 10 and the second conductivity type semiconductor device region 20 are fin field effect transistors. In some embodiments, the initial structure may be formed by etching the semiconductor on insulator layer 4a of a semiconductor on insulator substrate 5a. The semiconductor on insulator substrate 5a is similar to the extremely thin semiconductor on insulator substrate 5 that is depicted in FIG. 1 with the exception that the upper semiconductor layer, i.e., semiconductor on insulator layer 4a, of the semiconductor on insulator substrate 5a typically has a greater thickness than the semiconductor on insulator layer 4 of the extremely thin semiconductor on insulator substrate 5. For example, the thickness of the semiconductor on insulator layer 4a of the semiconductor on insulator substrate 5a may range from 5 nm to 100 nm. With the exception of the thickness of the semiconductor on insulator layer 4a, the remainder of the semiconductor on insulator substrate 5a is similar to the semiconductor on insulator substrate 5 that is depicted in FIG. 1.

In some embodiments, the semiconductor on insulator layer 4a of the semiconductor on insulator substrate 5 may be etched so that the remaining portions of the semiconductor on insulator layer 4a provide at least one first fin structure 36 in the first conductivity type semiconductor device region 10 of the semiconductor on insulator substrate 5a, at least one second fin structure 37 in the second conductivity type semiconductor device region 15 of the semiconductor on insulator substrate 5, and an island 50 of a remaining portion of the semiconductor on insulator layer 4a that is present in a diode region 15 of the semiconductor on insulator substrate 5a.

Prior to etching the semiconductor on insulator substrate 5 to provide the fin structures 36, 37, a layer of the dielectric material that provides a dielectric fin cap (not shown) can be formed atop the portions of the semiconductor on insulator substrate 5 in which the fin structures 36, 37 are to be formed. The dielectric fin cap may be composed of a nitride, oxide, oxynitride material, and/or any other suitable dielectric layer. The dielectric fin cap can be formed by a deposition process, such as chemical vapor deposition and/or atomic layer deposition (ALD). The dielectric fin cap may have a thickness ranging from 1 nm to 100 nm. The dielectric fin cap is optional and may be omitted. In the embodiments in which the dielectric fin cap is omitted, the semiconductor devices may be referred to as tri-gate semiconductor devices.

In some embodiments, following the formation of the layer of dielectric material that provides the dielectric fin cap, a photolithography and etch process sequence applied to the dielectric fin cap and the semiconductor on insulator substrate 5a may provide the initial structure that is depicted in FIG. 9. Specifically, in one example, a photoresist mask is formed overlying the layer of the dielectric material that provides dielectric fin cap and is present overlying the semiconductor on insulator layer 4 of the substrate, in which the portion of the dielectric material that is underlying the photoresist mask provides the dielectric fin cap, and the portion of the semiconductor on insulator layer 4 that is underlying the photoresist mask provides the fin structures 36, 37. The photoresist mask also protects the island 50 of the remaining portion of the semiconductor on insulator layer 4a that is present in a diode region 15. The exposed portions of the dielectric material that provides dielectric fin cap and the semiconductor on insulator layer 4a, which are not protected by the photoresist mask, are removed using a selective etch process. The etching process may remove the unprotected portions of the dielectric material that provides the dielectric fin cap followed by removing the unprotected portion of the semiconductor on insulator layer 4a selective to the underlying buried insulating layer 3. For example, the transferring of the pattern provided by the photoresist mask into the underlying structures may include an anisotropic etch. The anisotropic etch may include reactive ion etching. Although FIG. 9 depicts four fin structures 36 present in the first conductivity type semiconductor device region 10, and four fin structures 37 that are present in the second conductivity type semiconductor device region 20, the present disclosure is not limited to only this embodiment, as any number of fin structures 36, 37 may be present in each of the first conductivity type semiconductor device region 10 and the second conductivity type semiconductor device region 20.

Figure 10A:
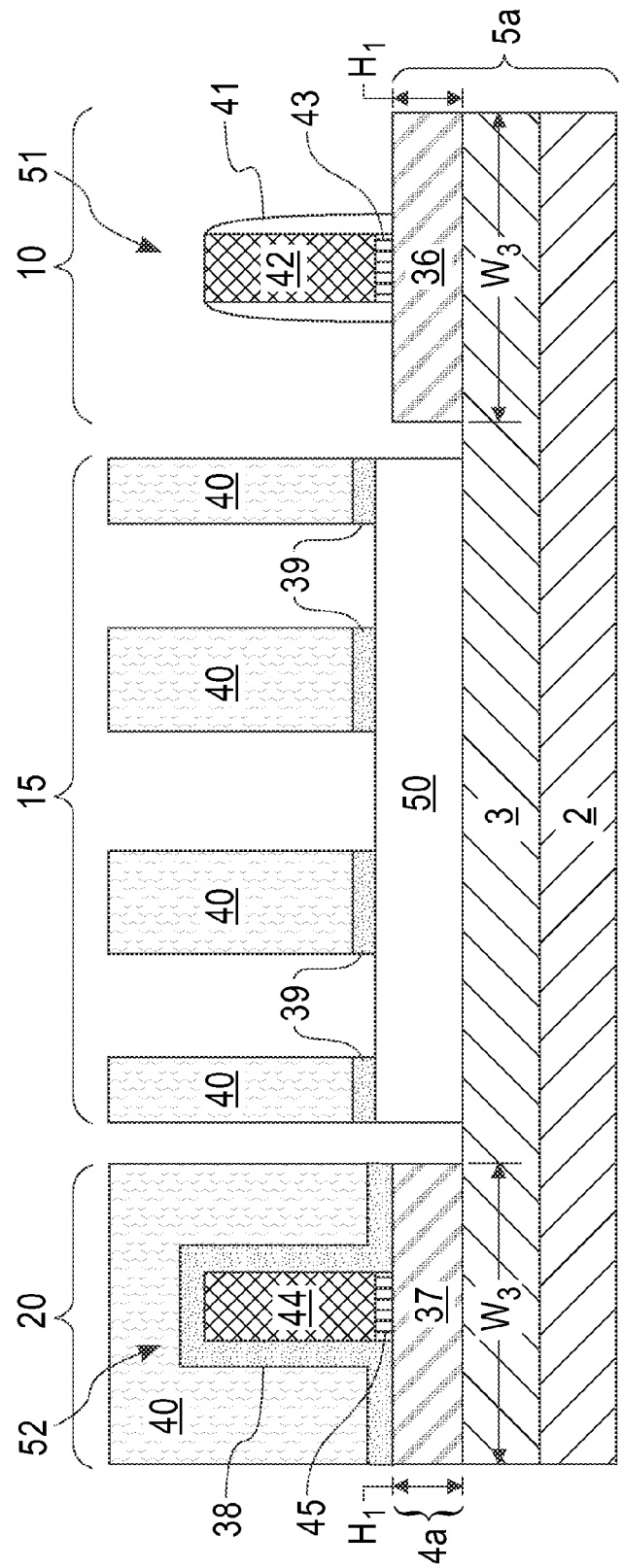
FIG. 10A is a side cross-sectional view depicting etching a dielectric layer to form at least one first gate sidewall spacer adjacent to the first gate structure of a fin field effect transistor in the first conductivity type semiconductor device region, a plurality of dielectric strips in the diode region, and a remaining portion of the dielectric layer on the second conductivity type semiconductor device region, in accordance with one embodiment of the present disclosure.

Referring to FIG. 10A, each of the fin structures 36, 37 may have a height $H_1$ ranging from 5 nm to 200 nm. In one embodiment, each of the fin structures 36, 37 has a height $H_1$ ranging from 10 nm to 100 nm. In another embodiment, each of the fin structures 36, 37 has a height $H_1$ ranging from 20 nm to 50 nm. In one embodiment, each of the fin structures 36, 37 has a width $W_3$ of less than 30 nm. In another embodiment, each of the fin structures 36, 37 has a width $W_3$ ranging from 3 nm to 15 nm.

Figure 10B:
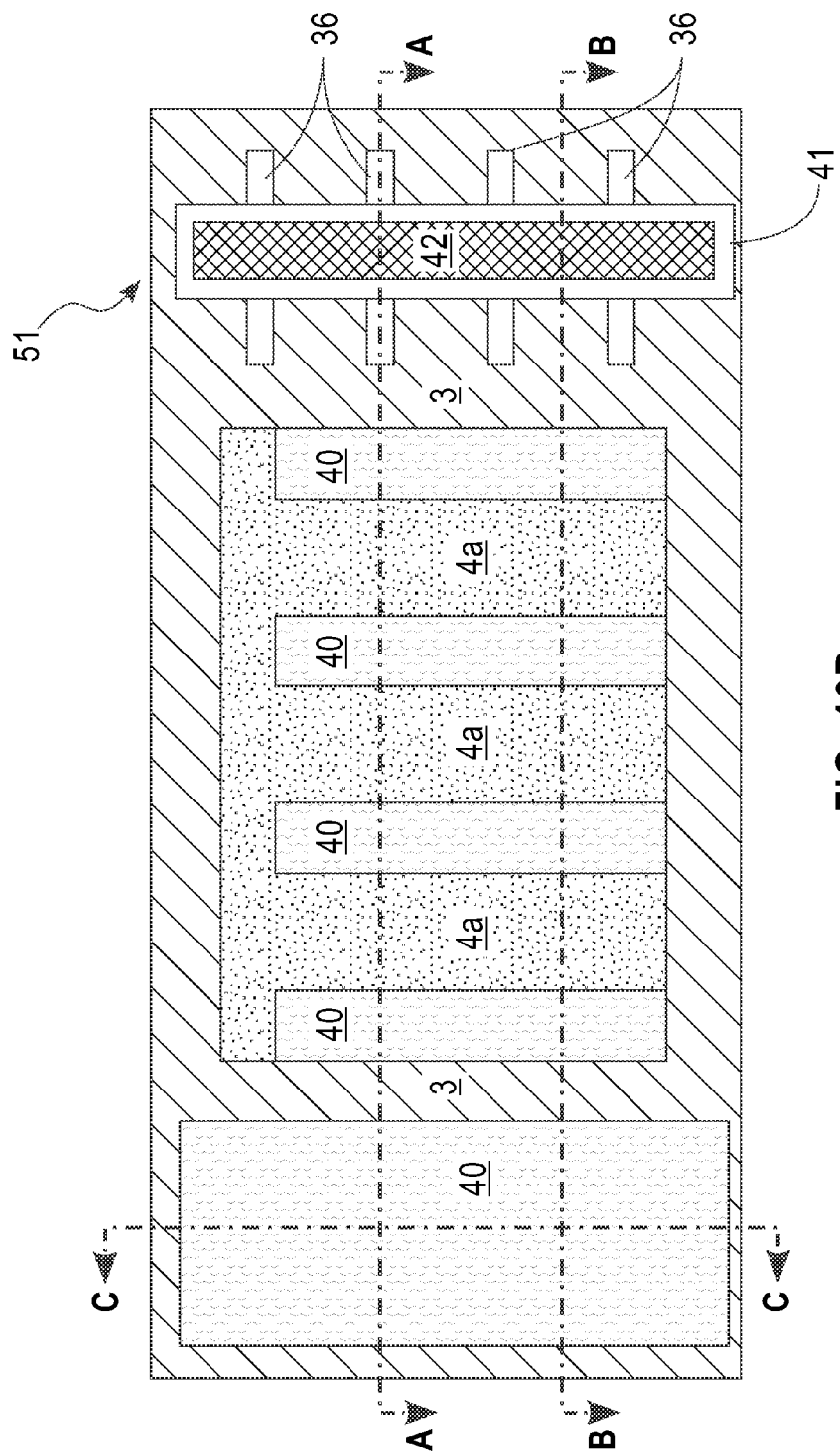
FIG. 10B is a top down view of the structure depicted in FIG. 10A.

FIGS. 10A and 10B depict one embodiment of forming gate structures 51, 52 on the fin structures 36, 37. The gate structures 51, 52 that are depicted in FIGS. 10A and 10B for the fin field effect transistors are similar to the gate structures 7, 8 for the planar field effect transistors that are described above with reference to FIGS. 2A and 2B. One difference between the gate structures 7, 8 for planar devices, and the gate structures 51, 52 that are present on the fin structures 36, 37 for the fin field effect transistors is that the gate dielectric 43, 45 is present on both a sidewall and upper surface of the portion of the fin structures 36, 37 that include the channel region of the fin field effect transistor, whereas the gate dielectric 9, 11 of the planar semiconductor devices is present only on the upper surface of the SOI layer 4 that provides the channel portion of the planar semiconductor devices. Despite the above noted difference, the gate structures 51, 52 for the fin structures 36, 37 that are depicted in FIG. 11 are similar to the gate structures 7, 8 for the planar devices depicted in FIG. 2A. Therefore, the above description of the at least one gate dielectric 9, 11 for the gate structures 7, 8 that are depicted in FIG. 2A is suitable for the description of the at least one gate dielectric 43, 45 of the gate structures 51, 52 to the fin structures 36, 37 that are depicted in FIG. 10A. Further, the description of the at least one gate conductor 12, 13 for the gate structures 7, 8 that are depicted in FIG. 2A is suitable for the description of the at least one gate conductor 42, 44 of the gate structures 51, 52 to the fin structures 36, 37 that are depicted in FIG. 10A.

FIGS. 10A and 10B further depict depositing a dielectric layer on the upper surfaces of the first conductivity type semiconductor device region 10, the diode region 15, and the second conductivity type semiconductor device region 20; and etching the dielectric layer to form at least one first gate sidewall spacer 41 adjacent to the first gate structure 51 of a fin field effect transistor in the first conductivity type semiconductor device region 10, a plurality of dielectric strips 39 in the diode region 15, and a remaining portion of the dielectric layer 38 on the second conductivity type device region 20. The dielectric layer that provides the at least one first gate sidewall spacer 41, the dielectric strips and the remaining portion of the dielectric layer 38 on the second conductivity type semiconductor device region 20 is similar to the dielectric layer 14 that is described above with reference to FIG. 3. Therefore, the above description of the dielectric layer 14 depicted in FIG. 3 is suitable for the dielectric layer that is described with reference to FIGS. 10A and 10B. In one embodiment, the dielectric layer is patterned and etched using photolithography and selective etching to provide the at least one first gate sidewall spacer 41, the dielectric strips and the remaining portion of the dielectric layer 38 on the second conductivity type semiconductor device region 20.

The patterning of the dielectric layer to provide the at least one first gate sidewall spacer 41, the dielectric strips 39 and the remaining portion of the dielectric layer 38 on the second conductivity device region 20 that are depicted in FIGS. 10A and 10B is similar to the patterning and etching of the dielectric layer 14 that is depicted in FIG. 3 to provide the at least one first gate sidewall spacer 16, the dielectric strips 17 and the remaining portion of the dielectric layer 18 on the second conductivity type semiconductor device region 20 that are depicted in FIGS. 4A and 4B. For example, referring to FIGS. 10A and 10B, before etching the dielectric layer, a first etch mask 40 is formed over the dielectric layer protecting the portions of the dielectric layer that provides the dielectric strips 17 and the remaining portion of the dielectric layer 18 on the second conductivity type semiconductor device region 20. The first etch mask 40 that is depicted in FIGS. 10A and 10B is similar to the first etch mask 19 that is depicted in FIGS. 4A and 4B. After forming the first etch mask 40, an anisotropic etch removes the exposed portions of the dielectric layer to provide the at least one first gate sidewall spacer 41, the dielectric strips 39 and the remaining portion of the dielectric layer 38 on the second conductivity type semiconductor device region 20. The anisotropic characteristics of the etch remove horizontal portions of the dielectric layer faster than vertical portions of the dielectric layer, which results in the formation of the at least one first gate sidewall spacer 41 that is present in the first conductivity type semiconductor device region 10. Further details regarding the photolithography and etch processes that provide the structure depicted in FIGS. 10A and 10B from the dielectric layer are described above with reference to FIGS. 4A and 4B.

FIG. 11 depicts forming a first portion of a first conductivity semiconductor material 54 on the semiconductor on insulating layer 4a on opposing sides of the first gate structure 51 of the fin field effect transistor in the first conductivity type semiconductor device region 10. FIG. 11 also depicts forming a second portion of the first conductivity semiconductor material 53 on the island portion 50 of the semiconductor on insulating layer 4a in the diode region 15. The first conductivity semiconductor material 53, 54 is an epitaxially deposited material that will not be formed on dielectric surfaces, such as the dielectric strips 39 that are present in the diode region 15. The first conductivity semiconductor material 53, 54 is not formed in the second conductivity semiconductor device region 20, because the second conductivity semiconductor device region 20 is protected by the remaining portion of the dielectric layer 38, and the first mask 40 when present. The portion of the first conductivity semiconductor material 54 that is present in the first conductivity type semiconductor device region 10 may provide the shared source region and the shared drain region between adjacent fin structures 36 that are present in the first conductivity type semiconductor device region 10. The second portion of the first conductivity semiconductor material 53 that is present in the diode region 15 may provide the first doped layer of a semiconductor diode. The first conductivity semiconductor material 53, 54 that is depicted in FIG. 11 is similar to the first conductivity semiconductor material 22, 21 that is depicted in FIGS. 5A and 5B. Therefore, the description regarding the composition and method of forming the first conductivity semiconductor material 21, 22 that is depicted in FIGS. 5A and 5B is suitable for the first conductivity semiconductor material 53, 54 that is depicted in FIG. 11.

The second portion of the first conductivity semiconductor material 53 on the island portion 50 of the semiconductor on insulating layer 4a that is present in the diode region 15 provides the first doped layer of a semiconductor diode. The semiconductor diode formed by the method depicted in FIGS. 9-11C is similar to the semiconductor diode that is formed by the method depicted by FIGS. 1-8B. Therefore, the description of the geometry, dimensions and composition of the second portion of the first conductivity semiconductor material 22 that provides the first doped layer of the semiconductor diode in FIGS. 5A and 5B is suitable for providing the description of the second portion of the first conductivity semiconductor material 53 that provides the first doped layer of the semiconductor diode that is formed in the diode region 15 that is depicted in FIG. 11.

Figure 12:
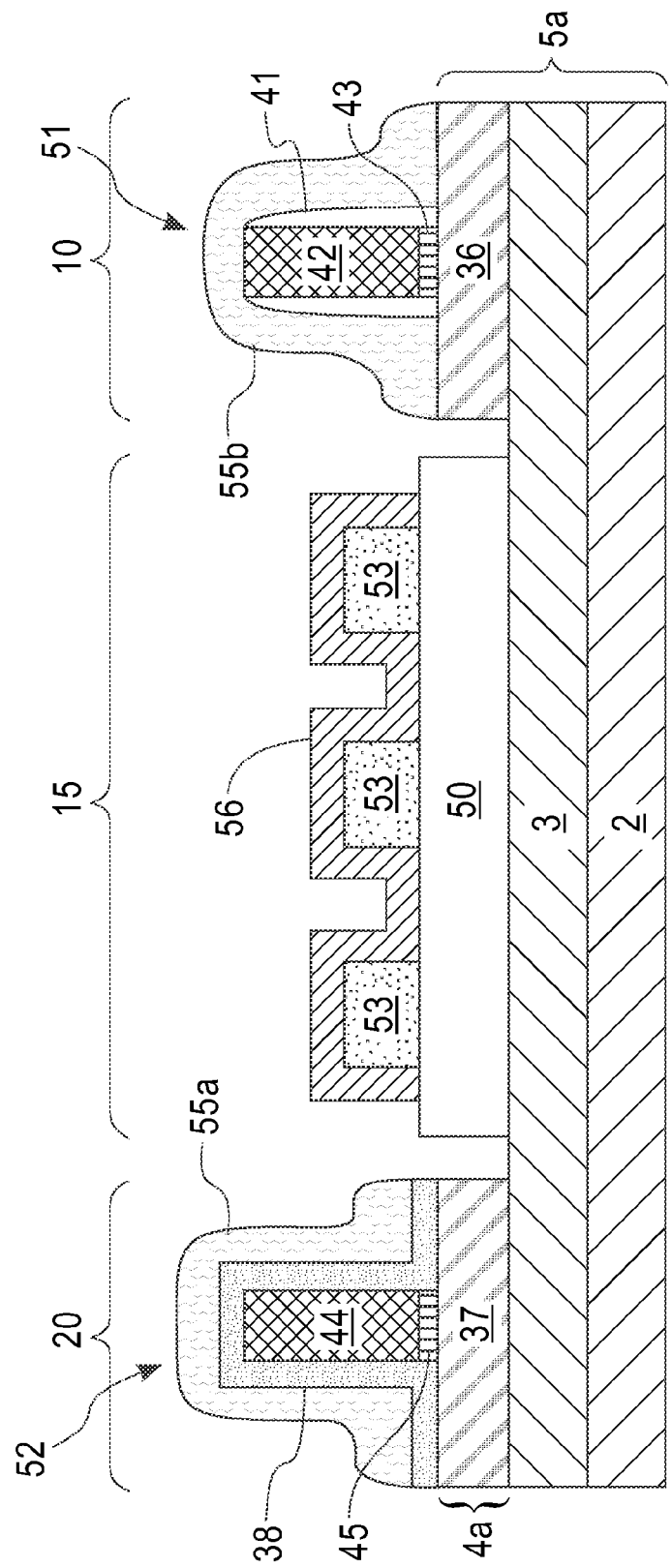
FIG. 12 is a side cross-sectional view depicting forming a first hard mask covering the first conductivity type semiconductor device region and the second conductivity type semiconductor device region, and forming an intrinsic semiconductor material on the first conductivity semiconductor material in the diode region, in accordance with one embodiment of the present disclosure.

FIG. 12 depicts forming a second mask 55a, 55b covering the first conductivity type semiconductor device region 10 and the second conductivity type semiconductor device region 20, and forming an intrinsic semiconductor material 56 on the first conductivity type semiconductor material 53 in the diode region 15. The process sequence for forming the second mask 55a, 55b and the intrinsic semiconductor material 56 that is depicted in FIG. 12 is similar to the process sequence for forming the second mask 25a, 25b and the intrinsic semiconductor material 26 that are depicted in FIGS. 6A and 6B. Therefore, the above description of the second mask 25a, 25b that is depicted in FIGS. 6A and 6B is suitable forming the first mask 55a, 55b and the intrinsic semiconductor material 56 that is depicted in FIG. 12. Although not depicted in FIG. 12, a masked region may be present over the diode region 15 that is similar to the mask 27 that is depicted in FIG. 6B. Similar to the process sequence described above with reference to FIGS. 1-8B, the intrinsic semiconductor material 56 may be omitted from the process sequence that is described with reference to FIGS. 9-13D.

Figure 13A:
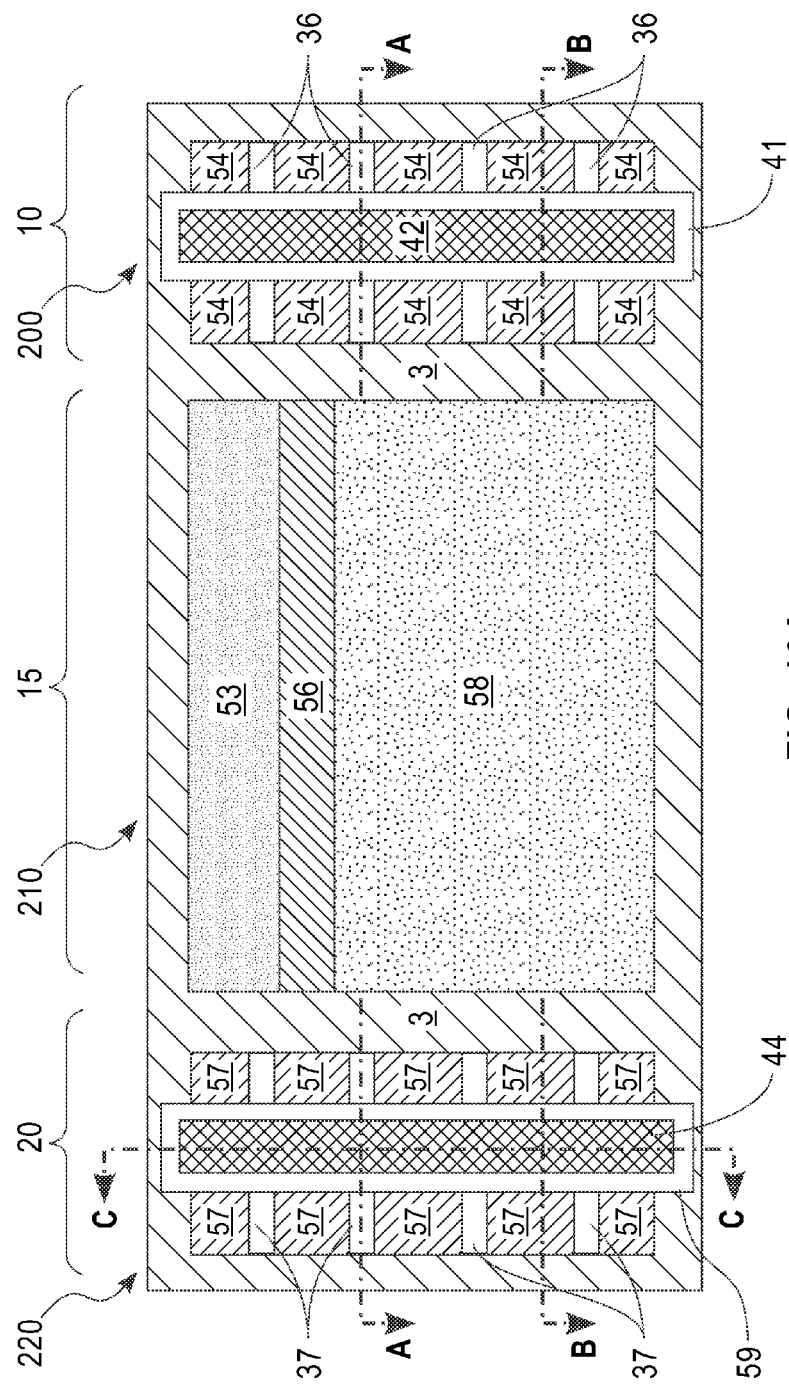
FIG. 13A is a top down view depicting forming a first portion of a second conductivity semiconductor material on the semiconductor on insulator layer on opposing sides of the second gate structure for the fin field effect transistor that is present in the second conductivity type semiconductor device region, and forming a second portion of the second conductivity semiconductor material on the intrinsic semiconductor material in the diode region, in accordance with one embodiment of the present disclosure.
Figure 13B:
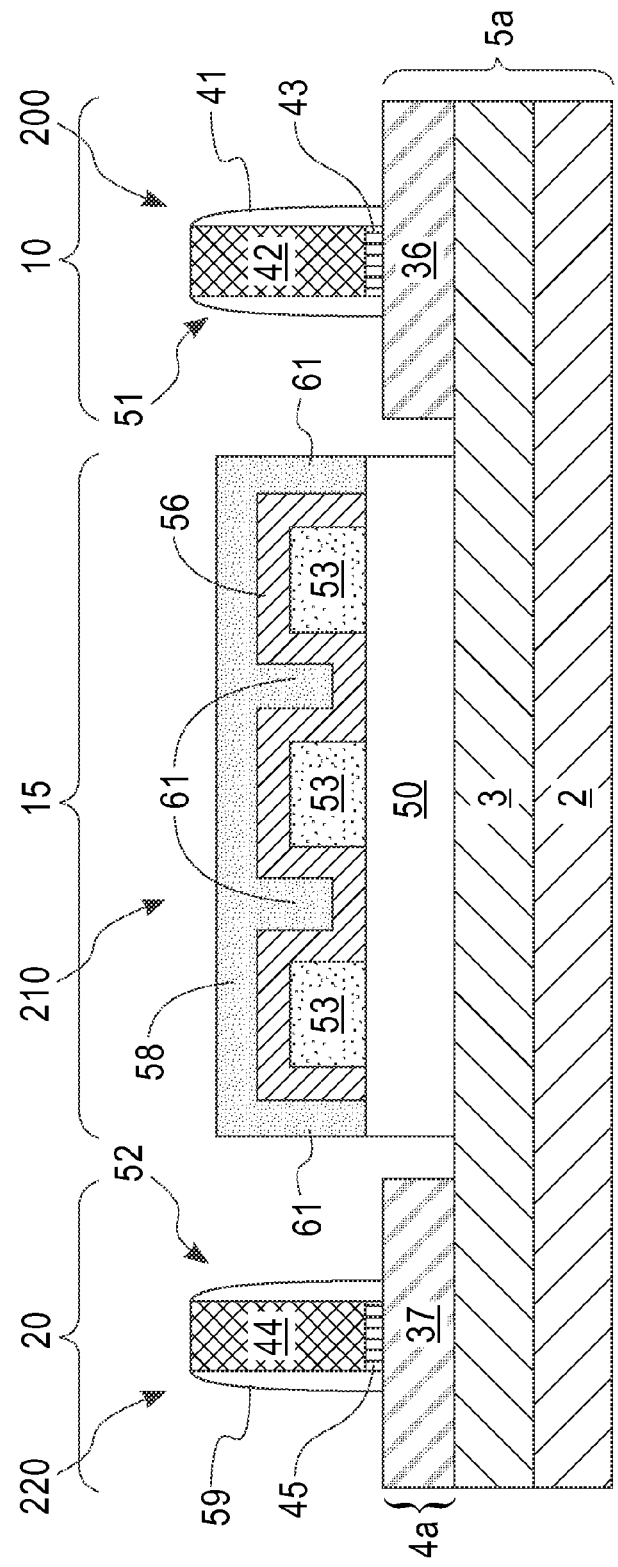
FIG. 13B is a side cross-sectional view along section line A-A in FIG. 13A.
Figure 13C:
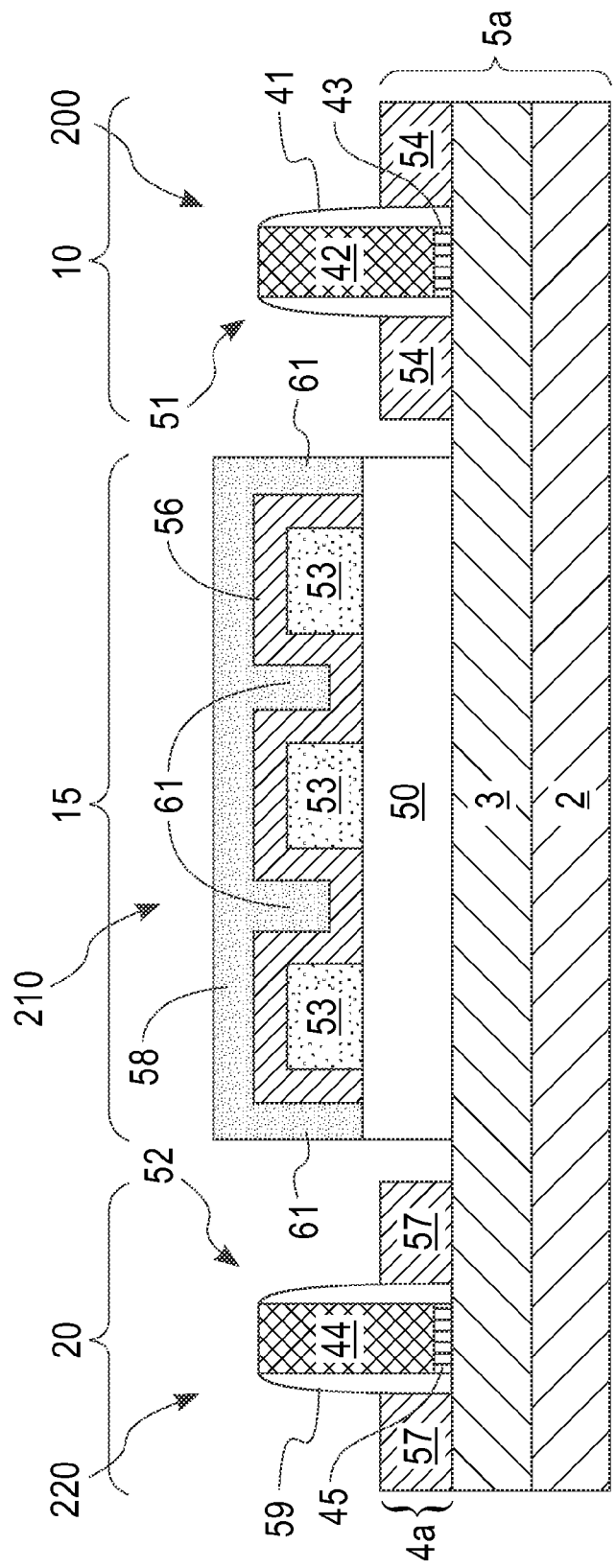
FIG. 13C is a side cross-sectional view along section line B-B in FIG. 13A.
Figure 13D:
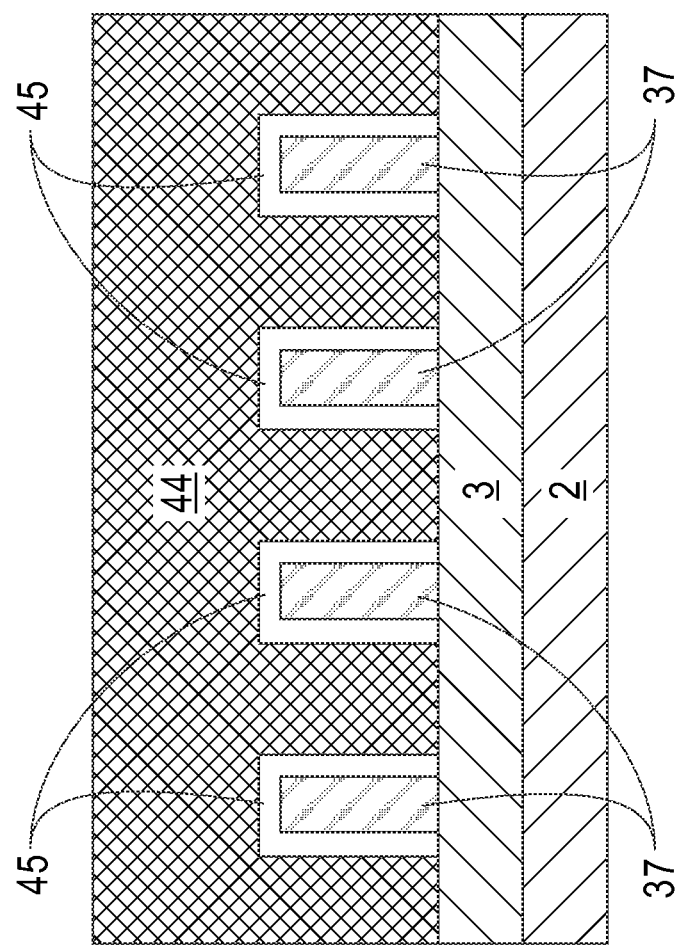
FIG. 13D is a side cross-sectional view along section line C-C in FIG. 13A.

FIGS. 13A-13D depict one embodiment of forming a first portion of a second conductivity semiconductor material 57 on the semiconductor on insulator layer 4a on opposing sides of the second gate structure 52 for the fin field effect transistor that is present in the second conductivity type semiconductor device region 20, and forming a second portion of the second conductivity semiconductor material 58 on the intrinsic semiconductor material 56 in the diode region 15. Prior to forming the second conductivity semiconductor material 57, 58, the remaining portion of the dielectric layer that is present in the second conductivity type semiconductor device region 20 can be etched to form at least one second gate sidewall spacer 59 adjacent to the second gate structure 52 that is present in the second conductivity type semiconductor device region 20. The at least one second gate sidewall spacer 59 that is depicted in FIGS. 13A-13C is similar to the at least one second gate sidewall spacer 30 that is described above with reference to FIGS. 7A and 7B. Therefore, the process sequence for forming the at least one second gate sidewall spacer 30 that is depicted in FIGS. 7A and 7B is suitable for describing the method of forming the at least one second gate sidewall spacer 59 that is depicted in FIGS. 13A and 13B.

The second conductivity semiconductor material 57, 58 is epitaxially deposited on the exposed semiconductor surfaces of the second conductivity type semiconductor device region 20 and the diode region 15, while the remaining portion of the second mask 55b obstructs the second conductivity semiconductor material 28, 29 from being formed on the first conductivity type semiconductor device region 10. The first portion of the second conductivity semiconductor material 57 that is present in the second conductivity type semiconductor device region 20 may provide the shared source region and the shared drain region between adjacent fin structures 37 that are present in the second conductivity type semiconductor device region 20.

The second portion of the second conductivity semiconductor material 58 on the intrinsic semiconductor layer 56 that is present in the diode region 15 provides the second doped layer of a semiconductor diode. The semiconductor diode formed by the method depicted in FIGS. 9-13C is similar to the semiconductor diode that is formed by the method depicted by FIGS. 1-8B. Therefore, the description of the geometry, dimensions and composition of the second portion of the second conductivity semiconductor material 29 that provides the second doped layer of the semiconductor diode in FIGS. 7A and 7B is suitable for providing the description of the second portion of the second conductivity semiconductor material 58 that provides the second doped layer of the semiconductor diode that is formed in the diode region 15 that is depicted in FIGS. 13A-13C.

In some embodiments, before forming the second conductivity semiconductor material 57, 58, a mask may be formed over a portion of the diode region 15 that is similar to the mask 33 depicted in FIG. 7B. By forming a mask covering a portion of the diode region 15 including a surface provided by an intrinsic semiconductor layer 56 and a first conductivity semiconductor material 53, these portions of the diode region 15 are protected from being covered by the epitaxially formed second portion of the second conductivity semiconductor material 58. In this embodiment, following formation of the second conductivity semiconductor material 57, 58, the mask may be removed to expose a portion of the first conductivity semiconductor material 53 that is present within the diode region 15. The exposed portion of the first conductivity semiconductor material 53 may be contacted by an electrical contact to provide electrical communication to the first doped layer of the semiconductor diode that is present in the diode region 15.

After forming the second conductivity semiconductor material 58, 59, an interlevel dielectric layer may be formed over the structure depicted in FIGS. 13A-13C, and contacts may be formed to the shared source and drain regions, i.e., first conductivity semiconductor material 54, of the first conductivity fin field effect transistor 200 that is present in the first conductivity type semiconductor device region 10. Contacts may also be formed to the first doped layer, i.e., first conductivity semiconductor material 53, and the second doped layer, i.e., second conductivity semiconductor material 58, of the semiconductor diode 210 in the diode region 15. Contacts may also be formed to the shared source and drain regions, i.e., second conductivity semiconductor material 57, of the second conductivity fin field effect transistor 200 that is present in the second conductivity type semiconductor device region 20.

FIGS. 13A and 13C depict one embodiment of an electrical device including a first conductivity semiconductor device 200 present in the first conductivity type semiconductor device region 10 of the semiconductor on insulator substrate 5a, and a second conductivity semiconductor device 220 present in the second conductivity type semiconductor device region 20 of the semiconductor on insulator substrate 5, in which the semiconductor devices 210, 220 are fin field effect transistors. The electrical device also includes a semiconductor diode 220 that is present within a diode region 15 of the thin semiconductor on insulator substrate 5a that includes a first doped layer of a first conductivity semiconductor material 53 that is present on the semiconductor on insulator layer 4a of the semiconductor on insulator substrate 5a. The first doped layer depicted in FIGS. 13A to 13C is similar to the first doped layer of the semiconductor diode 120 in the embodiment depicted in FIGS. 8A and 8B. Although not depicted in FIGS. 13A-13D, the first doped layer includes a first plurality of protrusions 23 extending from a first connecting base portion 22, which is clearly depicted in FIG. 5B. Referring to FIGS. 13A-13C, the semiconductor diode 210 further includes a second doped layer of the second conductivity semiconductor material 59 that is present over the first doped layer. The second doped layer includes a second plurality of protrusions 61 extending from a second connecting base portion, which is more clearly depicted in FIGS. 13B and 13C. The second plurality of protrusions 61 is present between and separating the first plurality of protrusions for the first conductivity semiconductor material 53 that provides the first doped layer of the semiconductor diode.

In one embodiment of the electrical device depicted in FIGS. 13A-13D, the first conductivity is a p-type conductivity and the second conductivity is an n-type conductivity. In this example, the first doped layer of the semiconductor diode 210, i.e., first conductivity semiconductor material 53, has a p-type conductivity and the second doped layer of the semiconductor diode, i.e., second conductivity semiconductor material 58, has an n-type conductivity. The present disclosure is not limited to only this embodiment, as the first doped layer of the semiconductor diode 210, i.e., first conductivity semiconductor material 53, may have an n-type conductivity and the second doped layer of the semiconductor diode, i.e., second conductivity semiconductor material 58, may have a p-type conductivity.

In some embodiments, the intrinsic semiconductor layer 56 that is depicted in FIGS. 13A-13D may be omitted. In the embodiments in which the intrinsic semiconductor layer 56 is omitted, the second doped layer of the second conductivity semiconductor material 58 that provides the second doped layer of the semiconductor diode 210 is in direct contact with the first conductivity semiconductor material 58 that provides the first doped layer of the semiconductor diode 210.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming an electrical device comprising:
   forming a first conductivity type semiconductor device region including a first fin structure, a second conductivity type semiconductor device region including a second fin structure, and a diode region including a semiconductor island in a semiconductor on insulator (SOI) layer of a semiconductor on insulator (SOI) substrate;
   forming a first gate structure on the first fin structure in the first conductivity type semiconductor device region, and a second gate structure on the second fin structure in the second conductivity type semiconductor device region;
   forming a first conductivity semiconductor material on the first fin structure on opposing sides of the first gate structure in the first conductivity type semiconductor device region and the semiconductor island in the diode region, wherein the first conductivity type semiconductor material on the first fin structure in the first conductivity type semiconductor device region provides a first conductivity source region and a first conductivity drain region; and
   forming a second conductivity semiconductor material on the second fin structure on opposing sides of the second gate structure that is present in the second conductivity type semiconductor device region and on the first conductivity semiconductor material in the diode region, wherein the second conductivity type semiconductor material that is present on the second fin structure in the second conductivity type semiconductor device region provides a second conductivity source region and a second conductivity drain region, and a stack of the second conductivity semiconductor material and the first conductivity semiconductor material in the diode region provides a semiconductor diode.

2. The method of claim 1, wherein prior to forming the second conductivity semiconductor material, an intrinsic semiconductor material is formed on the first conductivity type semiconductor material in the diode region, wherein the second conductivity semiconductor material that is formed on the diode region is in direct contact with the intrinsic semiconductor material.

3. The method of claim 2, wherein after forming the first gate structure and the second gate structure the method further comprises:
   depositing a dielectric layer on the SOI layer in the first conductivity type semiconductor device region, the second conductivity type semiconductor device region and the diode region; and
   etching the dielectric layer to form a first gate sidewall spacer adjacent to the first gate structure in the first conductivity type semiconductor device region, a plurality of dielectric strips in the diode region, and a remaining portion of the dielectric layer on the second conductivity type semiconductor device region.

4. The method of claim 3, wherein the forming the first conductivity semiconductor material on the SOI layer on opposing sides of the first gate structure in the first conductivity type semiconductor device region and the SOI layer in the diode region comprises an epitaxial deposition process, wherein the remaining portion of the dielectric layer obstructs the first conductivity semiconductor material from being formed on the second conductivity semiconductor device region and the plurality of strips obstructs the first conductivity semiconductor material from being formed on the portion of the SOI layer in the diode region that the plurality of strips are present on.

5. The method of claim 4, wherein forming the intrinsic semiconductor material on the first conductivity type semiconductor material in the diode region comprises forming a first hard mask covering the first conductivity type semiconductor device region and the second conductivity type semiconductor device region;
   removing the plurality of dielectric strips from the diode region; and
   epitaxially forming the intrinsic semiconductor material on the first conductivity semiconductor material and the SOI layer in the diode region.

6. The method of claim 1, wherein the forming the second conductivity semiconductor material on the SOI layer on opposing sides of the second gate structure that is present in the second conductivity type semiconductor device region and on the first conductivity semiconductor material in the diode region comprises forming a second hard mask over the first conductivity type semiconductor device region, and epitaxially forming the second conductivity semiconductor material.

* * * * *